United States Patent
Wang et al.

(10) Patent No.: US 12,389,769 B2
(45) Date of Patent: Aug. 12, 2025

(54) DISPLAY PANEL, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Binyan Wang, Beijing (CN); Feng Wei, Beijing (CN); Tianyi Cheng, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 17/914,850

(22) PCT Filed: Jun. 10, 2021

(86) PCT No.: PCT/CN2021/099487
§ 371 (c)(1),
(2) Date: Sep. 27, 2022

(87) PCT Pub. No.: WO2022/257083
PCT Pub. Date: Dec. 15, 2022

(65) Prior Publication Data
US 2024/0224637 A1   Jul. 4, 2024

(51) Int. Cl.
*H10K 59/13*   (2023.01)
*H10K 59/131*   (2023.01)
(52) U.S. Cl.
CPC ................... *H10K 59/131* (2023.02)
(58) Field of Classification Search
CPC .................................................. H10K 59/131
(Continued)

(56) References Cited

U.S. PATENT DOCUMENTS

2019/0288055 A1    9/2019   Sakai et al.
2021/0026478 A1*   1/2021   Lee ..................... G06F 3/04164

FOREIGN PATENT DOCUMENTS

CN    205541823 U  *  8/2016
CN    112102783 A  *  12/2020  ........... G09G 3/3225
(Continued)

OTHER PUBLICATIONS

Cite the machine translation Li X (CN-112885876-A).*
(Continued)

*Primary Examiner* — Phuc T Dang
(74) *Attorney, Agent, or Firm* — Calfee, Halter & Griswold LLP

(57) ABSTRACT

A display panel includes a base substrate, a second conductive portion, and first, second and fourth conductive layers located at a side of the base substrate. The first conductive layer includes a first gate line of which orthographic projection extends along a first direction and a partial structure forms a fourth transistor's gate and a first conductive portion forming a driving transistor's gate. The second conductive layer includes a second gate line of which orthographic projection extends along the first direction and is located between orthographic projections of the first conductive portion and the first gate line, and a partial structure forms a second transistor's first gate. Orthographic projection of the second conductive portion at least partially overlaps with that of the first gate line. The fourth conductive layer includes a first connection portion connected to the first and second conductive portions through a via hole.

20 Claims, 21 Drawing Sheets

(58) Field of Classification Search
USPC .......................................................... 257/71
See application file for complete search history.

(56) References Cited

FOREIGN PATENT DOCUMENTS

| CN | 112885876 A | * | 6/2021 | ......... H01L 27/3262 |
| WO | 2021/102904 A1 | | 6/2021 | |

OTHER PUBLICATIONS

Cite the machine translation Chen T (CN-112102783-A).*
Cite the machine translation Huo S (CN-205541823-U).*
Extend European Search Report application No. 21944592.1 dated Jul. 31, 2024.

* cited by examiner

DISPLAY PANEL, DISPLAY DEVICE

CROSS-REFERENCE

The present application is a 35 U.S.C. 371 national phase application of PCT International Application No. PCT/CN2021/099487 filed on Jun. 10, 2021, the entire disclosure of which is incorporated herein as a part of the present disclosure for all purposes.

TECHNICAL FIELD

The present disclosure relates to a field of display technology, and more particularly to a display panel and a display device.

BACKGROUND

In the related art, in order to reduce leakage current of a driving transistor in a light-emitting stage, a pixel driving circuit may be formed by using low temperature polycrystalline oxide (LTPO) technology.

A display panel formed by LTPO technology includes an N-type oxide transistor and a P-type low temperature polysilicon transistor. The oxide transistor needs a separate gate line to provide a gate driving signal, and voltage change on the gate line may adversely affect normal drive of the display panel.

It should be noted that the information disclosed in this section is only for enhancing understanding of the BACKGROUND of the disclosure and therefore, may contain information that does not constitute the prior art that is already known to those skilled in the art.

SUMMARY

According to a first aspect of the present disclosure, a display panel is provided and includes a pixel driving circuit, the pixel driving circuit includes a driving transistor, a second transistor and a fourth transistor, the second transistor is provided with a first electrode connected to a gate of the driving transistor and a second electrode connected to a second electrode of the driving transistor, the fourth transistor is provided with a first electrode connected to a data line and a second electrode connected to a first electrode of the driving transistor, the driving transistor and the fourth transistor are P-type low temperature polysilicon transistors, the second transistor is an N-type oxide transistor, the display panel further includes: a base substrate; a first conductive layer located at a side of the base substrate and including: a first gate line and a first conductive portion, an orthographic projection of the first gate line on the base substrate extending along a first direction, a partial structure of the first gate line being configured to form a gate of the fourth transistor, and the first conductive portion being configured to form the gate of the driving transistor; a second conductive layer located at the side of the base substrate and including a second gate line, an orthographic projection of the second gate line on the base substrate extending along the first direction, and a partial structure of the second gate line being configured to form a first gate of the second transistor, and the orthographic projection of the second gate line on the base substrate being located between an orthographic projection of the first conductive portion on the base substrate and the orthographic projection of the first gate line on the base substrate; a second conductive portion, an orthographic projection of the second conductive portion on the base substrate at least partially overlapping with the orthographic projection of the first gate line on the base substrate; a fourth conductive layer located at the side of the base substrate and including a first connection portion connected to the first conductive portion and the second conductive portion respectively through a via hole.

In an exemplary embodiment of the present disclosure, the second conductive layer is located at a side of the first conductive layer away from the base substrate, and the fourth conductive layer is located at a side of the second conductive layer away from the base substrate.

In an exemplary embodiment of the present disclosure, the second conductive portion includes a first conductive sub-portion formed in a same layer as the second conductive layer, an orthographic projection of the first conductive sub-portion on the base substrate at least partially overlaps with the orthographic projection of the first gate line on the base substrate, and the first connection portion is connected to the first conductive sub-portion through a via hole.

In an exemplary embodiment of the present disclosure, the pixel driving circuit further includes a first transistor provided with a first electrode connected to the gate of the driving transistor and a second electrode connected to a first initialization signal line, and the display panel further includes: a second active layer located at the side of the base substrate and including a first active portion, wherein a partial structure of the first active portion is configured to form channel regions of the first transistor and the second transistor; the display panel further includes a fifth conductive layer located at a side of the second active layer away from the base substrate and including: a power line, wherein an orthographic projection of the power line on the base substrate extends along a second direction and covers an orthographic projection of the first active portion on the base substrate, and an overlapping area of the orthographic projection of the power line on the base substrate and an orthographic projection of the first connection portion on the base substrate is less than 70% of an area of the orthographic projection of the first connection portion on the base substrate.

In an exemplary embodiment of the present disclosure, the second active layer is located between the second conductive layer and the fourth conductive layer, and the fifth conductive layer is located at a side of the fourth conductive layer away from the base substrate.

In an exemplary embodiment of the present disclosure, the pixel driving circuit further includes a capacitor connected between the gate of the driving transistor and the power line, the first conductive portion is further configured to form an electrode of the capacitor, and the second conductive layer further includes: a third conductive portion configured to form another electrode of the capacitor, wherein an orthographic projection of the third conductive portion on the base substrate at least partially overlaps with the orthographic projection of the first conductive portion on the base substrate, and the third conductive portion is defined with a first opening, wherein the first connection portion is connected to the first conductive portion through a first via hole, an orthographic projection of the first via hole on the base substrate is located within an orthographic projection of the first opening on the base substrate; the power line includes: a first extension portion, wherein an orthographic projection of the first extension portion on the base substrate extends along the second direction and at least partially overlaps with the orthographic projection of the first opening on the base substrate; a second extension portion, wherein an orthographic projection of at least a partial structure of the second extension portion on the base substrate extends along the second direction, and the orthographic projection of the second extension portion on the base substrate covers the orthographic projection of the first active portion on the base substrate; a third extension portion connected between the first extension portion and the second extension portion, wherein an orthographic projection of the third extension portion on the base substrate extends along the first direction and at least partially overlaps with the orthographic projection of the first opening on the base substrate.

In an exemplary embodiment of the present disclosure, the second extension portion includes a first extension sub-portion, and an orthographic projection of the first extension sub-portion on the base substrate extends along the first direction; the second conductive layer further includes: a third gate line, a partial structure of the third gate line is configured to form a first gate of the first transistor; the orthographic projection of the first extension sub-portion on the base substrate at most partially overlaps with an orthographic projection of the third gate line on the base substrate.

In an exemplary embodiment of the present disclosure, the fourth conductive layer further includes: the first initialization signal line, wherein an orthographic projection of the first initialization signal line on the base substrate extends along the first direction, and the first initialization signal line is configured to provide a first initialization signal line; the orthographic projection of the first extension sub-portion on the base substrate at least partially overlaps with the orthographic projection of the first initialization signal line on the base substrate.

In an exemplary embodiment of the present disclosure, the display panel further includes: a second active layer located between the second conductive layer and the fourth conductive layer; the second conductive portion includes a second active portion formed in a same layer as the second active layer, an orthographic projection of the second active portion on the base substrate at least partially overlaps with the orthographic projection of the first gate line on the base substrate, and the second active portion is electrically connected to the first connection portion.

In an exemplary embodiment of the present disclosure, the pixel driving circuit further includes a first transistor, the first transistor is provided with a first electrode connected to the gate of the driving transistor and a second electrode connected to a first initialization signal line the second conductive layer further includes: a third gate line, wherein a partial structure of the third gate line is configured to form a first gate of the first transistor, and an orthographic projection of the third gate line on the base substrate extends along the first direction and is located at a side of the orthographic projection of the first gate line on the base substrate away from the orthographic projection of the second gate line on the base substrate; the second active layer includes a first active portion including a first active sub-portion, a second active sub-portion, and a third active sub-portion connected between the first active sub-portion and the second active sub-portion; wherein the first active sub-portion is configured to form a channel region of the first transistor, the second active sub-portion is configured to form a channel region of the second transistor, and the first connection portion is connected to the third active sub-portion through a via hole, and an orthographic projection of the third active sub-portion on the base substrate at least partially overlaps with the orthographic projection of the first gate line on the base substrate.

In an exemplary embodiment of the present disclosure, an overlapping area of the orthographic projection of the second active portion on the base substrate and the orthographic projection of the second gate line on the base substrate is less than 50% of an area of the orthographic projection of the second active portion on the base substrate.

In an exemplary embodiment of the present disclosure, the pixel driving circuit further includes a capacitor connected between the gate of the driving transistor and a power line, and the second conductive layer further includes: a third conductive portion configured to form an electrode of the capacitor, and the electrode being connected to the power line; the second active portion includes: a fourth active sub-portion connected to the third active sub-portion, wherein an orthographic projection of the fourth active sub-portion on the base substrate extends along the first direction and at least partially overlaps with the orthographic projection of the first gate line on the base substrate; a fifth active sub-portion connected to the fourth active sub-portion, wherein an orthographic projection of the fifth active sub-portion on the base substrate extends along a second direction and intersects with the orthographic projection of the second gate line on the base substrate; a sixth active sub-portion connected to the fifth active sub-portion, wherein an orthographic projection of the sixth active sub-portion on the base substrate at least partially overlaps with an orthographic projection of the third conductive portion on the base substrate.

In an exemplary embodiment of the present disclosure, a size of the orthographic projection of the fifth active sub-portion on the base substrate in the first direction is smaller than a size of the orthographic projection of the sixth active sub-portion on the base substrate in the first direction.

In an exemplary embodiment of the present disclosure, an overlapping area of the orthographic projection of the fourth active sub-portion on the base substrate and the orthographic projection of the first gate line on the base substrate is S1; an overlapping area of the orthographic projection of the fifth active sub-portion on the base substrate and the orthographic projection of the second gate line on the base substrate is S2; wherein S1 is larger than S2.

In an exemplary embodiment of the present disclosure, the pixel driving circuit further includes a capacitor connected between the gate of the driving transistor and a power line, and the second conductive layer further includes: a third conductive portion configured to form an electrode of the capacitor, and the electrode being connected to the power line; the first connection portion includes: a fourth conductive portion connected to the third active sub-portion through a via hole, wherein an orthographic projection of the fourth conductive portion on the base substrate at least partially overlaps with the orthographic projection of the first gate line on the base substrate; a fifth conductive portion connected to the fourth conductive portion, wherein an orthographic projection of the fifth conductive portion on the base substrate overlaps with the orthographic projection of the second gate line on the base substrate; a sixth conductive portion connected to the fifth conductive portion, wherein an orthographic projection of the sixth conductive portion on the base substrate at least partially overlaps with the orthographic projection of the third conductive portion on the base substrate; wherein a size of the orthographic projection of the fifth conductive portion on the base substrate in the first direction is smaller than a size of the orthographic projection of the sixth conductive portion on the base substrate in the first direction.

In an exemplary embodiment of the present disclosure, the first connection portion includes a fourth conductive portion, a fifth conductive portion and a sixth conductive portion, and the fourth conductive portion is connected to the third active sub-portion through a via hole, and an orthographic projection of the fourth conductive portion on the base substrate covers the orthographic projection of the fourth active sub-portion on the base substrate. The fifth conductive portion is connected to the fourth conductive portion, and an orthographic projection of the fifth conductive portion on the base substrate covers the orthographic projection of the fifth active sub-portion on the base substrate. The sixth conductive portion is connected to the fifth conductive portion, and an orthographic projection of the sixth conductive portion on the base substrate covers the orthographic projection of the sixth active sub-portion on the base substrate. A size of the orthographic projection of the fifth conductive portion on the base substrate in the first direction is smaller than a size of the orthographic projection of the sixth conductive portion on the base substrate in the first direction.

In an exemplary embodiment of the present disclosure, the display panel further includes a fifth conductive layer located at a side of the fourth conductive layer away from the base substrate, and the fifth conductive layer includes: a power line, an orthographic projection of the power line on the base substrate extending along a second direction and covering the orthographic projection of the second active portion on the base substrate.

In an exemplary embodiment of the present disclosure, the power line includes a sixth extension portion and a seventh extension portion, wherein a size of an orthographic projection of the sixth extension portion on the base substrate in the first direction is larger than a size of an orthographic projection of the seventh extension portion on the base substrate in the first direction; the orthographic projection of the sixth extension portion on the base substrate covers the orthographic projection of the second active portion on the base substrate.

In an exemplary embodiment of the present disclosure, the sixth extension portion is defined with a second opening, and an orthographic projection of the second opening on the base substrate at least partially overlaps with the projection of the second gate line on the base substrate.

In an exemplary embodiment of the present disclosure, the display panel further includes: an anode layer located at a side of the fifth conductive layer away from the base substrate, the anode layer includes a plurality of anode portions, and orthographic projections of the anode portions on the base substrate cover the orthographic projection of the first active portion on the base substrate.

In an exemplary embodiment of the present disclosure, the display panel further includes: a first active layer located between the base substrate and the first conductive layer, and a partial structure of the first active layer being configured to form channel regions of the driving transistor and the fourth transistor; a third conductive layer located between the second active layer and the fourth conductive layer and including a fourth gate line and a fifth gate line; wherein an orthographic projection of the fourth gate line on the base substrate extends along the first direction and at least partially overlaps with the orthographic projection of the second gate line on the base substrate, and a partial structure of the fourth gate line is configured to form a second gate of the second transistor. An orthographic projection of the fifth gate line on the base substrate extends along the first direction and at least partially overlaps with the orthographic projection of the third gate line on the base substrate, and a partial structure of the fifth gate line is configured to form a second gate of the first transistor.

According to a second aspect of the present disclosure, a display device is provided and includes the above display panel.

It is to be understood that the preceding general description and the following detailed description are exemplary and explanatory only and are not restrictive of the present disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings can also be obtained from these drawings without creative efforts.

DETAILED DESCRIPTION

Figure 1:
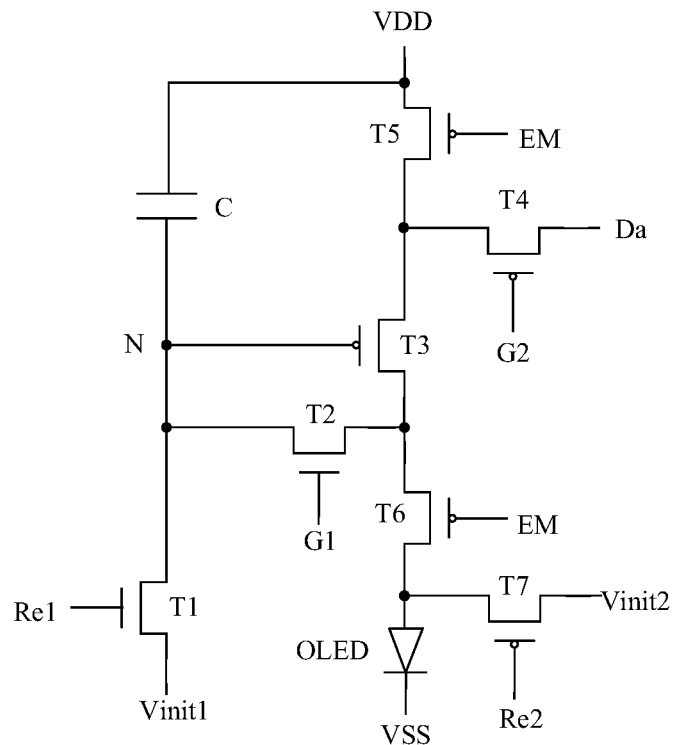
FIG. 1 is a schematic view of a circuit structure of a pixel driving circuit in the related art.

Example embodiments will now be described more fully with reference to the accompanying drawings. However, the example embodiments may be implemented in a variety of forms, and should not be understood as being limited to the examples set forth herein. On the contrary, providing these embodiments makes the present disclosure more comprehensive and complete, and comprehensively communicates the concept of the example embodiments to those skilled in the art. The same reference numerals in the drawings denote the same or similar structures, and therefore repeated descriptions thereof will be omitted.

Terms "one", "a/an" and "said" are used to denote the presence of one or a plurality of elements/components/etc. Terms "including" and "having" are used to denote the meaning of non-exclusive inclusion and refer to that there may be other elements/components/etc. in addition to the listed elements/components/etc.

FIG. 1 shows a schematic view of a circuit structure of a pixel driving circuit in the related art. The pixel driving circuit may include a driving transistor T3, a first transistor T1, a second transistor T2, a third transistor T3, a fourth transistor T4, a fifth transistor T5, a sixth transistor T6, a seventh transistor T7, and a capacitor C. The fourth transistor T4 is provided with a first electrode connected to a data signal terminal Da, a second electrode connected to a first electrode of the driving transistor T3, and a gate connected to a second gate driving signal terminal G2. The fifth transistor T5 is provided with a first electrode connected to a first power terminal VDD, a second electrode connected to the first electrode of the driving transistor T3, and a gate connected to an enable signal terminal EM. A gate of the driving transistor T3 is connected to a node N, and the second transistor T2 is provided with a first electrode connected to the node N, a second electrode connected to a second electrode of the driving transistor T3 and a gate connected to a first gate driving signal terminal G1. The sixth transistor T6 is provided with a first electrode connected to the second electrode of the driving transistor T3, a second electrode connected to a first electrode of the seventh transistor T7, and a gate connected to the enable signal terminal EM. The seventh transistor T7 is provided with a second electrode connected to a second initialization signal terminal Vinit2 and a gate connected to a second reset signal terminal Re2. The first transistor T1 is provided with a first electrode connected to node N, a second electrode connected to a first initialization signal terminal Vinit1, and a gate connected to a first reset signal terminal Re1. The capacitor C is connected between the first power terminal VDD and the node N. The pixel driving circuit may be connected to a light-emitting unit OLED for driving the light-emitting unit OLED to emit light, and the light-emitting unit OLED may be connected between the second electrode of the sixth transistor T6 and a second power terminal VSS. The first transistor T1 and the second transistor T2 may be N-type metal oxide transistors. The N-type metal oxide transistor has a relatively small leakage current, so as to prevent the node N from leaking through the first transistor T1 and the second transistor T2 during the light-emitting stage. Moreover, the driving transistor T3, the third transistor T3, the fourth transistor T4, the fifth transistor T5, the sixth transistor T6 and the seventh transistor T7 may be P-type low temperature polysilicon transistors with a relatively high carrier mobility, which is conducive to the realization of a display panel with high resolution, high reaction speed, high pixel density and high aperture ratio. The first initialization signal terminal and the second initialization signal terminal may output the same or different voltage signals according to actual situation.

Figure 2:
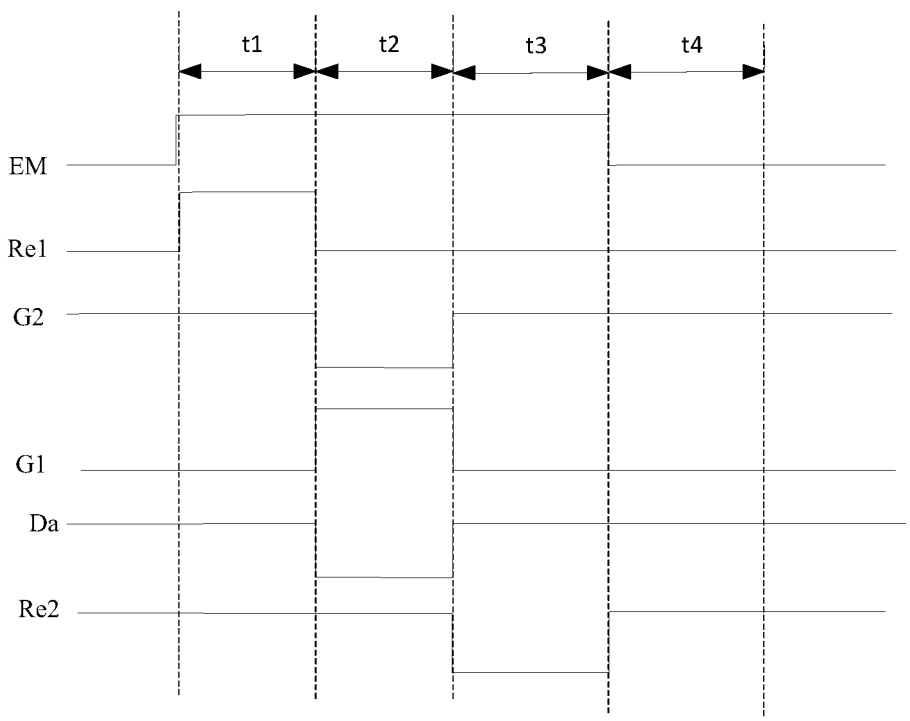
FIG. 2 is a timing chart of each node in a driving method of the pixel driving circuit of FIG. 1.

FIG. 2 shows a timing chart of each node in a driving method of the pixel driving circuit of FIG. 1. G1 represents timing of the first gate driving signal terminal G1, G2 represents timing of the second gate driving signal terminal G2, Re1 represents timing of the first reset signal terminal Re1, Re2 represents timing of the second reset signal terminal Re2, EM represents timing of the enable signal terminal EM, and Da represents timing of the data signal terminal Da. Driving method of the pixel driving circuit may include a first reset stage t1, a compensation stage t2, a second reset stage t3, and a light-emitting stage t4. In the first reset stage t1, the first reset signal terminal Re1 outputs a high-level signal, the first transistor T1 is turned on, and the first initialization signal terminal Vinit1 inputs an initialization signal to the node N. In the compensation stage t2, the first gate driving signal terminal G1 outputs a high-level signal, the second gate driving signal terminal G2 outputs a low-level signal, the fourth transistor T4, the second transistor T2, and the data signal terminal Da output a driving signal to write a voltage Vdata+Vth to the node N, in which the Vdata is a voltage of the driving signal, and the Vth is a threshold voltage of the driving transistor T3. In the second reset stage t3, the second reset signal terminal Re2 outputs a low-level signal, the seventh transistor T7 is turned on, and the second initialization signal terminal Vinit2 inputs an initialization signal to the second electrode of the sixth transistor T6. In the light-emitting stage t4: the enable signal terminal EM outputs a low-level signal, the sixth transistor T6 and the fifth transistor T5 are turned on, and the driving transistor T3 emits light under action of the voltage Vdata+Vth stored in the capacitor C. According to output current formula of the driving transistor I=($\mu$WCox/2L)(Vgs−Vth)$^2$, where u is the carrier mobility, Cox is the gate capacitance per unit area, W is a width of a channel of the driving transistor, L is a length of the channel of the driving transistor, Vgs is a gate-source voltage difference of the driving transistor, and Vth is a threshold voltage of the driving transistor. The output current I of the driving transistor in the pixel driving circuit of the present disclosure is I=($\mu$WCox/2L)(Vdata+Vth−Vdd−Vth)$^2$. The pixel driving circuit may prevent the influence of the threshold value of the driving transistor on its output current. It should be understood that the pixel driving circuit shown in FIG. 1 may also have other driving methods. For example, the first transistor T1 and the seventh transistor T7 may be both reset in the first reset stage, and thus the second reset stage may be not set in this driving method.

Figure 3:
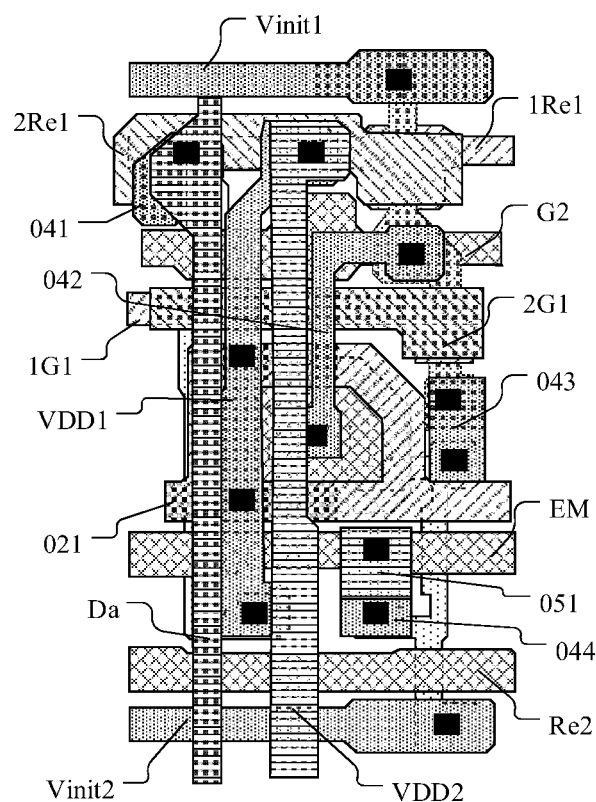
FIG. 3 is a structural layout of the display panel in the related art.
Figure 4:
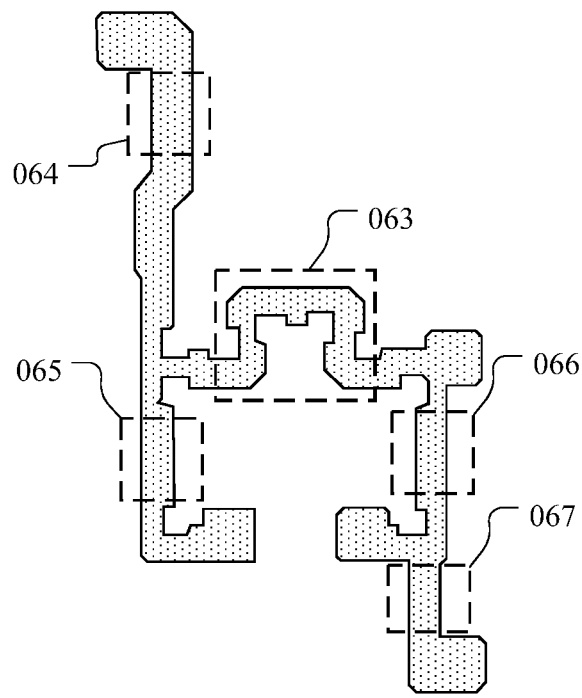
FIG. 4 is a structural layout of the first active layer in FIG. 3.
Figure 5:
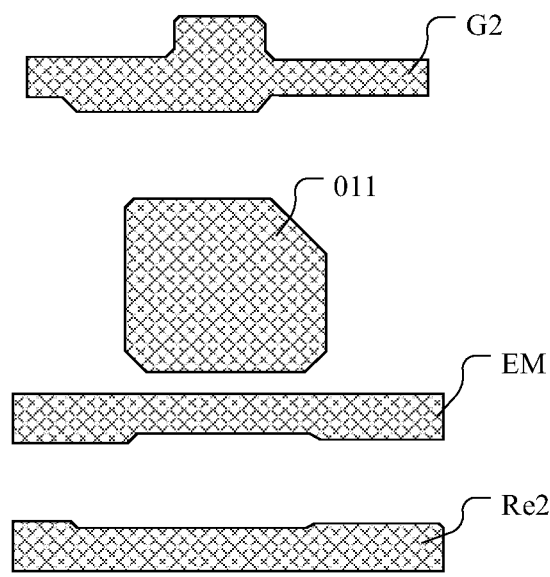
FIG. 5 is a structural layout of the first conductive layer in FIG. 3.
Figure 6:
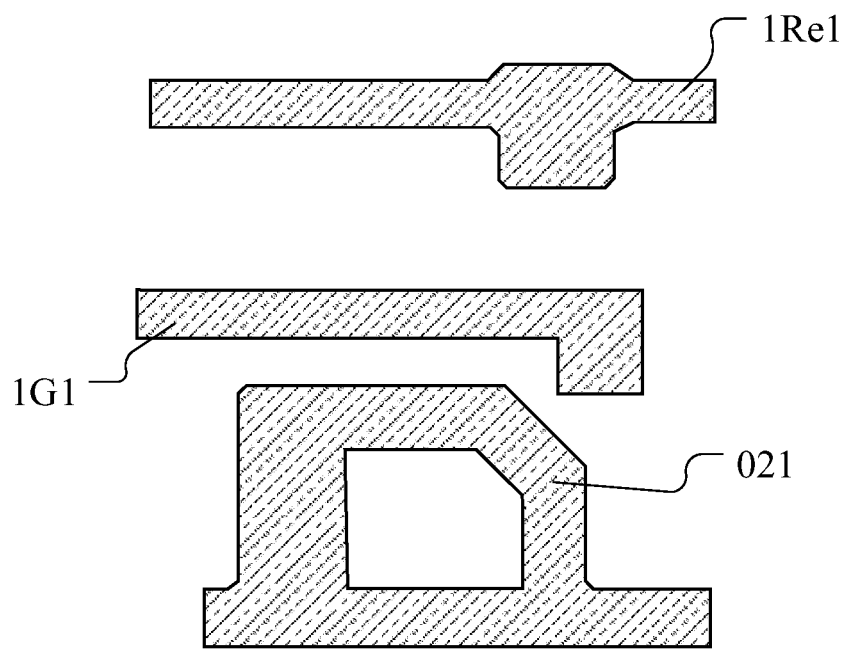
FIG. 6 is a structural layout of the second conductive layer in FIG. 3.
Figure 7:
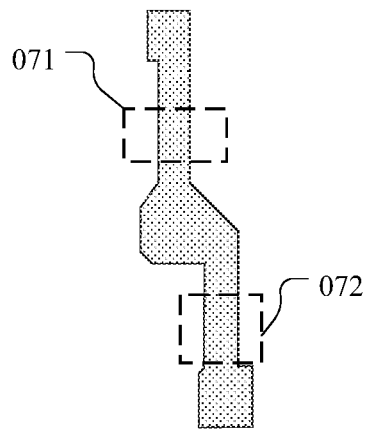
FIG. 7 is a structural layout of the second active layer in FIG. 3.
Figure 8:
FIG. 8 is a structural layout of the third conductive layer in FIG. 3.
Figure 8:
Figure 9:
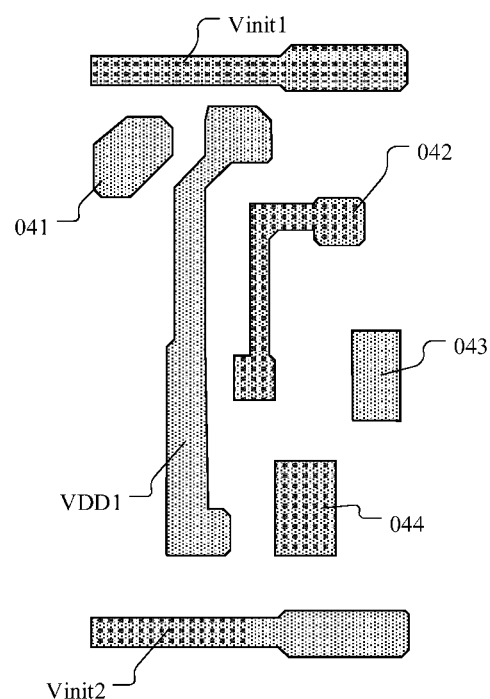
FIG. 9 is a structural layout of the fourth conductive layer in FIG. 3.
Figure 10:
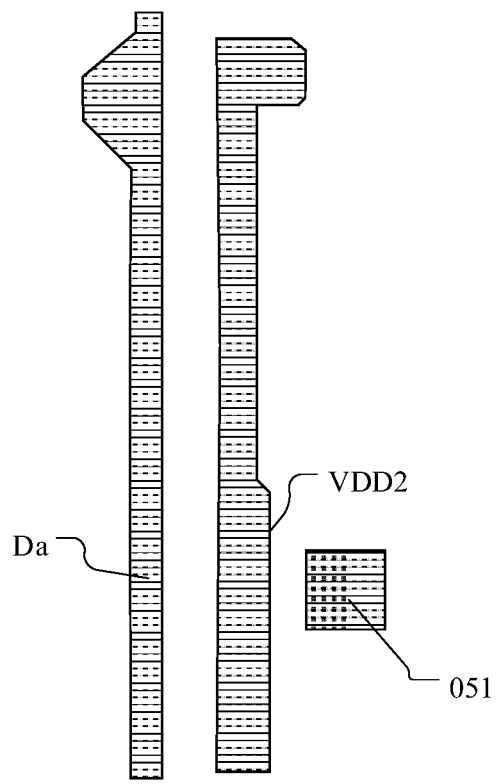
FIG. 10 is a structural layout of the fifth conductive layer in FIG. 3.
Figure 11:
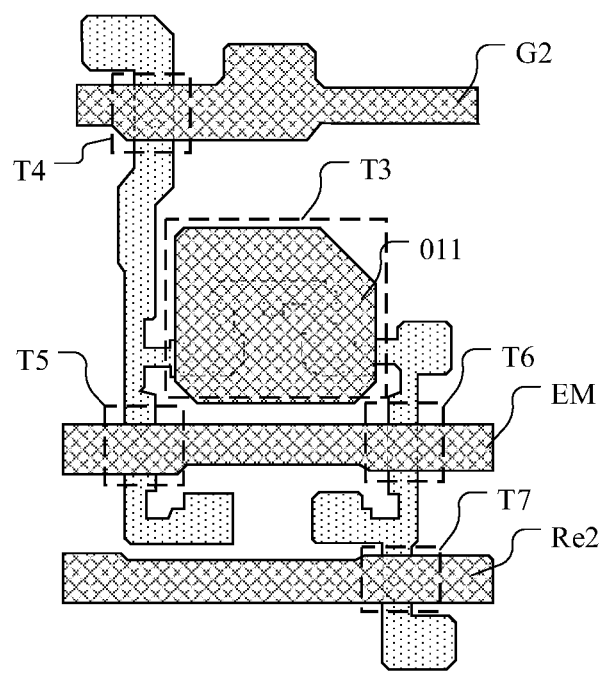
FIG. 11 is a structural layout of the first active layer and the first conductive layer in FIG. 3.
Figure 12:
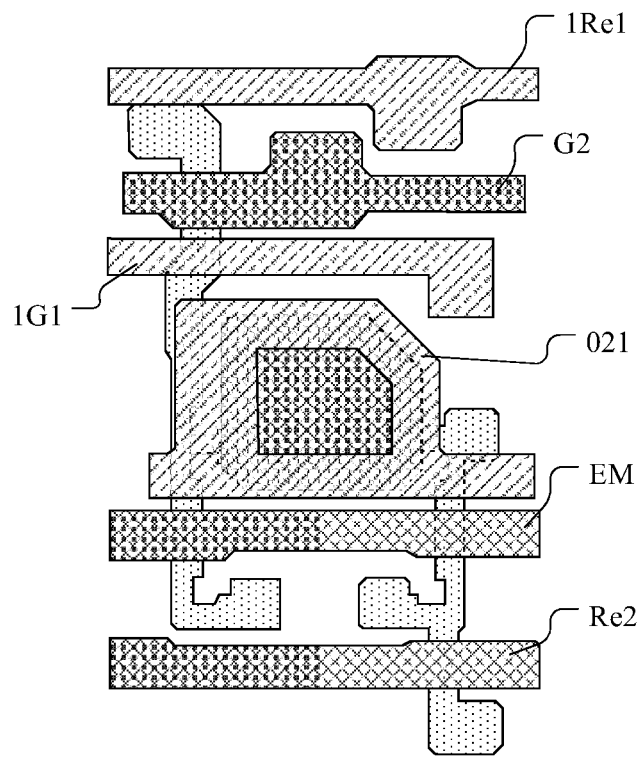
FIG. 12 is a structural layout of the first active layer, the first conductive layer and the second conductive layer in FIG. 3.
Figure 13:
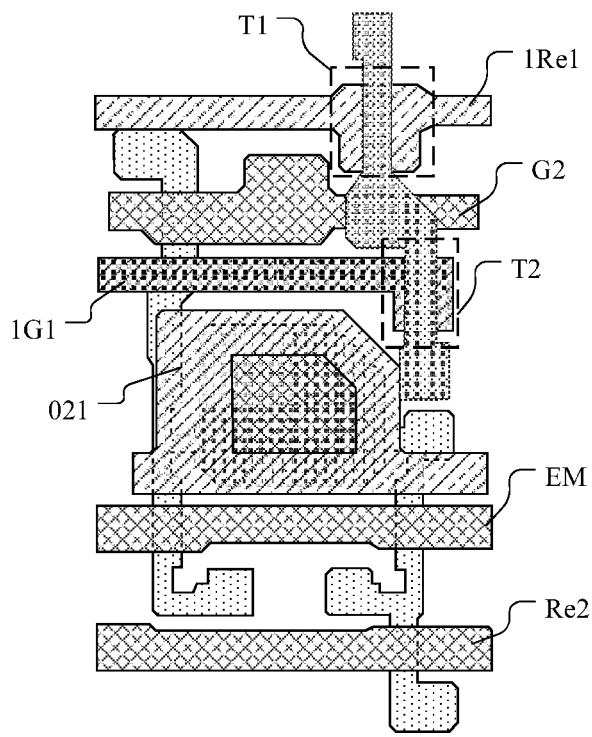
FIG. 13 is a structural layout of the first active layer, the first conductive layer, the second conductive layer and the second active layer in FIG. 3.
Figure 14:
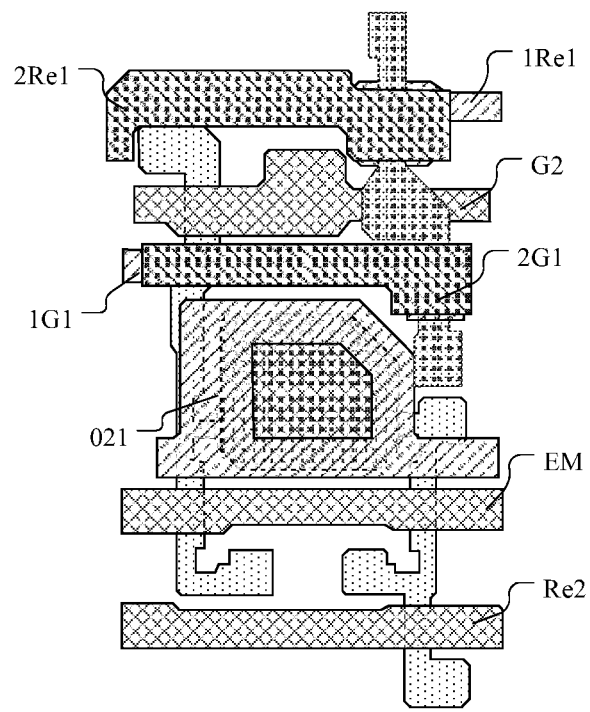
FIG. 14 is a structural layout of the first active layer, the first conductive layer, the second conductive layer, the second active layer and the third conductive layer in FIG. 3.
Figure 15:
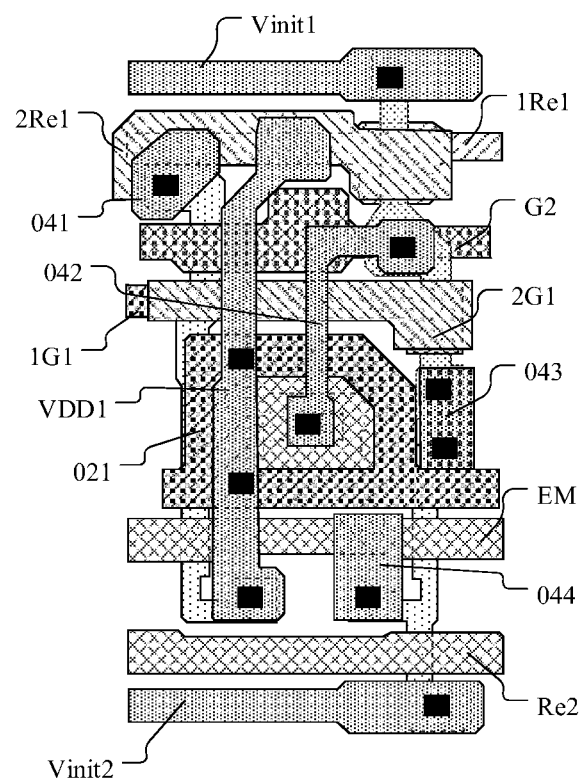
FIG. 15 is a structural layout of the first active layer, the first conductive layer, the second conductive layer, the second active layer, the third conductive layer and the fourth conductive layer in FIG. 3.

In the related art, the display panel may include the pixel driving circuit shown in FIG. 1, and the display panel may further include a substrate, a first active layer, a first conductive layer, a second conductive layer, a second active layer, a third conductive layer, a fourth conductive layer, and a fifth conductive layer which are sequentially stacked. As shown in FIGS. 3-15, FIG. 3 is a structural layout of the display panel in the related art; FIG. 4 is a structural layout of the first active layer in FIG. 3; FIG. 5 is a structural layout of the first conductive layer in FIG. 3; FIG. 6 is a structural layout of the second conductive layer in FIG. 3; FIG. 7 is a structural layout of the second active layer in FIG. 3; FIG. 8 is a structural layout of the third conductive layer in FIG. 3; FIG. 9 is a structural layout of the fourth conductive layer in FIG. 3; FIG. 10 is a structural layout of the fifth conductive layer in FIG. 3; FIG. 11 is a structural layout of the first active layer and the first conductive layer in FIG. 3; FIG. 12 is a structural layout of the first active layer, the first conductive layer and the second conductive layer in FIG. 3; FIG. 13 is a structural layout of the first active layer, the first conductive layer, the second conductive layer and the second active layer in FIG. 3; FIG. 14 is a structural layout of the first active layer, the first conductive layer, the second conductive layer, the second active layer and the third conductive layer in FIG. 3; FIG. 15 is a structural layout of the first active layer, the first conductive layer, the second conductive layer, the second active layer, the third conductive layer and the fourth conductive layer in FIG. 3;

As shown in FIGS. 3, 4 and 11, the first active layer may include an active portion 064, an active portion 065, an active portion 066 and an active portion 067, the active portion 064 is configured to form a channel region of the fourth transistor, the active portion 065 is configured to form a channel region of the fifth transistor, the active portion 066 is configured to form a channel region of the sixth transistor, and the active portion 067 is configured to form a channel region of the seventh transistor, and the active portion 063 is configured to form a channel region of the driving transistor T3. The first active layer may be formed of a polysilicon semiconductor.

As shown in FIGS. 3, 5 and 11, the first conductive layer may include a second gate driving signal line G2, an enable signal line EM, a second reset signal line Re2, and a conductive portion 011. The second gate driving signal line G2 is configured to provide the second gate driving signal terminal in FIG. 1, the enable signal line EM is configured to provide the enable signal terminal in FIG. 1, and the second reset signal line is configured to provide the second reset signal terminal in FIG. 1. The conductive portion 011 is configured to form a gate of the driving transistor T3 and an electrode of the capacitor C. The first active layer may be formed by conductorization using the first conductive layer as a mask, and that is, a part shielded by the first conductive layer may be formed as a channel region of the transistor, and a part not shielded by the first conductive layer may be formed as the conductor structure.

As shown in FIGS. 3, 6 and 12, the second conductive layer may include a first reset signal sub-line 1Re1, a first gate driving signal sub-line 1G1, and a conductive portion 021, the first reset signal sub-line 1Re1 is configured to provide the first reset signal terminal in FIG. 1, and the first gate driving signal sub-line 1G1 is configured to provide the first gate driving signal terminal in FIG. 1, and the conductive portion 021 may form the other electrode of the capacitor C.

As shown in FIGS. 3, 7 and 13, the second active layer may include an active portion 071 configured to form a channel region of the first transistor and an active portion 072 configured to form a channel region of the second transistor. The second active layer may be formed of an oxide semiconductor, such as indium gallium zinc oxide.

As shown in FIGS. 3, 8 and 14, the third conductive layer may include: a second reset signal sub-line 2Re1, a second gate driving signal sub-line 2G1, the second reset signal sub-line 2Re1 is configured to provide the first reset signal terminal in FIG. 1, and the second gate driving signal sub-line 2G1 is configured to provide the first gate driving signal terminal in FIG. 1. The second reset signal sub-line 2Re1 and the first reset signal sub-line 1R1 may be connected through a via hole, and the second gate driving signal sub-line 2G1 and the first gate driving signal sub-line 1G1 may be connected through a via hole. The second active layer may be formed by conductorization using the third conductive layer as a mask, and that is, a part shielded by the third conductive layer may be formed as a channel region of the transistor, and a part not shielded by the third conductive layer may be formed as the conductor structure.

As shown in FIGS. 3, 9, and 15, the fourth conductive layer may include a first power line VDD1, a first initialization signal line Vinit1, a second initialization signal line Vinit2, a connection portion 041, a connection portion 042, a connection portion 043, and a connection portion 044. The first power line VDD1 is configured to provide the first power terminal in FIG. 1, the first initialization signal line Vinit1 is configured to provide the first initialization signal terminal in FIG. 1, and the second initialization signal line Vinit2 is configured to provide the second initialization signal terminal in FIG. 1. The connection portion 041 may be connected to the first active layer on a side of the active portion 064 through a via hole (black square), so as to connect the first electrode of the fourth transistor. The connection portion 042 may be connected to the conductive portion 011 and the second active layer between the active portion 071 and the active portion 072 through a via hole, respectively, so as to connect the gate of the driving transistor and the first electrode of the first transistor, and connect the gate of the driving transistor and the first electrode of the second transistor. The connection portion 043 may be connected to the first active layer on a side of the active portion 066 and the second active layer on a side of the active portion 072 through a via hole, so as to connect the first electrode of the sixth transistor and the second electrode of the second transistor. The connection portion 044 may be connected to the first active layer on the side of the active portion 066 through a via hole, so as to connect the second electrode of the sixth transistor. The first power line VDD1 may be connected to the first active layer on the side of the active portion 065 through a via hole, so as to connect the first electrode of the fifth transistor and the first power terminal. The first power line VDD1 may also be connected to the conductive portion 021 through a via hole, so as to connect the capacitor C and the first power terminal. The first initialization signal line Vinit1 may be connected to the second active layer on a side of the active portion 071 through a via hole, so as to connect the second electrode of the first transistor and the first initialization signal terminal. The second initialization signal line may be connected to the first active layer on a side of the active portion 067 through a via hole, so as to connect the second initialization signal terminal and the second electrode of the seventh transistor.

As shown in FIGS. 3 and 10, the fifth conductive layer may include a second power line VDD2, a data line Da, and a connection portion 051. The second power line VDD2 is configured to provide the first power terminal in FIG. 1, and the data line Da is configured to provide the data signal terminal in FIG. 1. The second power line VDD2 may be connected to the first power line VDD1 through a via hole. The data line Da may be connected to the connection portion 041 through a via hole to connect the first electrode of the fourth transistor and the data signal terminal. The connection portion 051 may be connected to the connection portion 044 through a via hole, and the connection portion 051 may be configured to connect an anode of the light-emitting unit in FIG. 1. As shown in FIG. 3, an orthographic projection of the first power line VDD1 on the base substrate may be located between an orthographic projection of the data line Da on the base substrate and an orthographic projection of the conductive portion 011 on the base substrate, and the first power line VDD1 may shield interference of the data line Da on the conductive portion 011.

As shown in FIGS. 3, 12 and 15, an orthographic projection of the first gate line driving signal sub-line 1G1 on the base substrate is located between a second gate line driving signal line G2 and the conductive portion 011. As shown in FIG. 2, at end of a compensation stage T2, a signal at the first gate driving signal terminal changes from a high level to a low level, and a signal at the second gate driving signal terminal changes from a low level to a high level, and that is, at the end of the compensation stage T2, the signal at the first sub gate driving signal line 1G1 changes from a high level to a low level, and the signal at the second gate line driving signal line G2 changes from a low level to a high level. The first gate line driving signal sub-line 1G1 is closer to the conductive portion 011 than the second gate line driving signal line G2, such that at the end of the compensation stage T2, a pull-down effect of the first gate line driving signal sub-line 1G1 on the gate (conductive portion 011) of the driving transistor T3 is stronger than a pull-up effect of the second gate line driving signal line G2 on the gate (conductive portion 011) of the driving transistor T3. The gate (conductive portion 011) of the driving transistor T3 is pulled down at the end of the compensation stage T2, thereby affecting a brightness of the light-emitting unit in the light-emitting stage.

Figure 16:
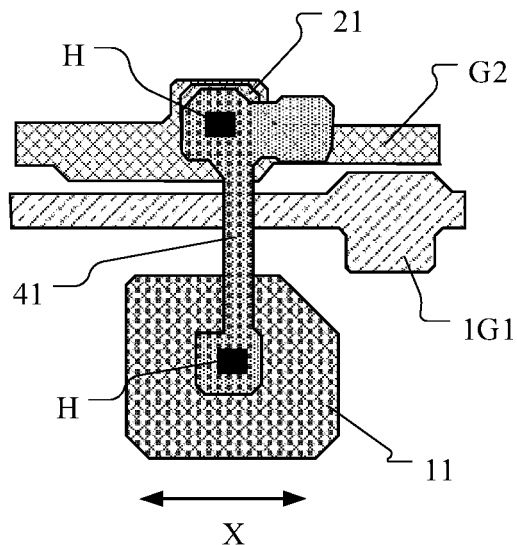
FIG. 16 is a structural layout of an exemplary embodiment of a display panel of the present disclosure.
Figure 17:
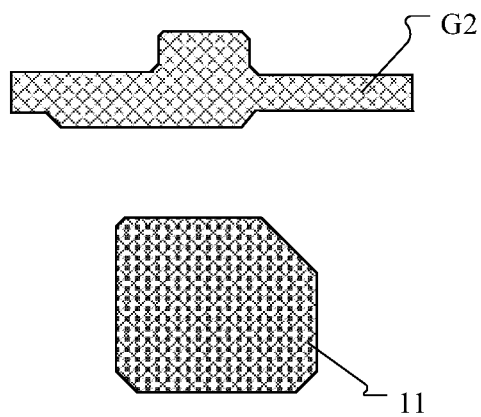
FIG. 17 is a structural layout of the first conductive layer in FIG. 16.
Figure 18:
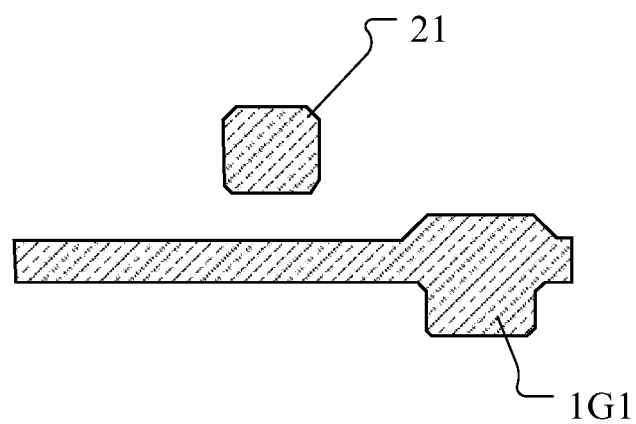
FIG. 18 is a structural layout of the second conductive layer in FIG. 16.
Figure 19:
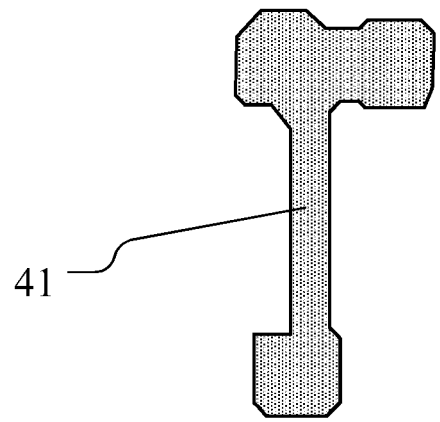
FIG. 19 is a structural layout of the fourth conductive layer in FIG. 16.

Based on this, the present exemplary embodiment provides a display panel, and the display panel includes a pixel driving circuit. Structure of the pixel driving circuit may be shown in FIG. 1, as shown in FIGS. 16-19. FIG. 16 is a structural layout of an exemplary embodiment of the display panel of the present disclosure, FIG. 17 is a structural layout of the first conductive layer in FIG. 16, FIG. 18 is a structural layout of the second conductive layer in FIG. 16, and FIG. 19 is a structural layout of the fourth conductive layer in FIG. 16. The display panel may further include: a base substrate, a first conductive layer, a second conductive layer, a second conductive portion and a fourth conductive layer. The second conductive portion may include a first conductive sub-portion 21, which may be formed in the same layer as the second conductive layer, and that is, the first conductive sub-portion 21 and the second conductive layer are formed through the same patterning process, and the first conductive sub-portion 21 is located at the second conductive layer. The first conductive layer may be located at a side of the base substrate and may include: a first gate line G2 and a first conductive portion 11, an orthographic projection of the first gate line G2 on the base substrate may extend along a first direction X, a partial structure of the first gate line G2 may be configured to form a gate of the fourth transistor T4, and the first conductive portion 11 may be configured to form the gate of the driving transistor T3. The second conductive layer may be located at the side of the base substrate and may include a second gate line 1G1, an orthographic projection of the second gate line 1G1 on the base substrate may extend along the first direction X, and a partial structure of the second gate line 1G1 may be configured to form a first gate of the second transistor T2, and the orthographic projection of the second gate line 1G1 on the base substrate may be located between an orthographic projection of the first conductive portion 11 on the base substrate and the orthographic projection of the first gate line G2 on the base substrate. An orthographic projection of the second conductive portion on the base substrate may at least partially overlap with the orthographic projection of the first gate line G2 on the base substrate. For example, the orthographic projection of the first conductive sub-portion 21 on the base substrate may at least partially overlap with the orthographic projection of the first gate line G2 on the base substrate. The fourth conductive layer may be located at the side of the base substrate and may include a first connection portion 41 connected to the first conductive portion 11 and the second conductive portion respectively through a via hole H, respectively. For example, the first connection portion 41 may be connected to the first conductive portion 11 and the first conductive sub-portion 21 respectively through the via hole H. The first conductive portion 11 may also be configured to form an electrode of the capacitor C.

In the present exemplary embodiment, the first gate line G2 may provide the second gate driving signal terminal G2 in FIG. 1, and the second gate line 1G1 may provide the first gate driving signal terminal G1 in FIG. 1. In the present exemplary embodiment, the first conductive sub-portion 21 is further provided at the second conductive layer, the orthographic projection of the first conductive sub-portion 21 on the base substrate at least partially overlaps with the orthographic projection of the first gate line G2 on the base substrate, and the first conductive sub-portion 21 may form a parallel-plate capacitor with the first gate line G2. The first gate line G2 has a certain coupling effect on the first conductive sub-portion 21. Since the first conductive sub-portion 21 is connected to the gate of the driving transistor (the first conductive portion 11) through the first connection portion 41, this arrangement may increase the coupling effect of the first gate line G2 on the gate of the driving transistor (the first conductive portion 11), and that is, at the end of the compensation stage T2, the first gate line G2 has a pull-up effect on the gate of the driving transistor (the first conductive portion 11). On the one hand, the combined action of the first gate line G2 and the first conductive sub-portion 21 may counteract the pull-down effect of the second gate line 1G1 on the gate of the driving transistor (the first conductive portion 11), so as to keep a voltage of the gate of the driving transistor unchanged at the end of the compensation stage. On the other hand, the combined action of the first gate line G2 and the first conductive sub-portion 21 may also increase the voltage of the gate of the driving transistor at the end of the compensation stage, thereby reducing a voltage of a data signal to be provided at the data signal terminal when the display panel is black, which reduces the power of a source driving circuit.

In the present exemplary embodiment, as shown in FIGS. 16-19, the second conductive layer may be located at a side of the first conductive layer away from the base substrate, and the fourth conductive layer may be located at a side of the second conductive layer away from the base substrate. In the present exemplary embodiment, there is a small distance between the first conductive sub-portion 21 and the first gate line G2, such that the first gate line G2 may have a strong coupling effect on the first conductive sub-portion 21. It should be understood that the first conductive layer, the second conductive layer and the fourth conductive layer may also have other relative position relationships, and the first conductive sub-portion 21 may also be located in another conductive layer. For example, the first conductive sub-portion 21 may be located at a light-shading metal layer, a source and drain layer, and the like. Accordingly, in another exemplary embodiment, the distance between the first conductive sub-portion 21 and the first gate line G2 may also be reduced by reducing a thickness of an insulating layer between the first conductive sub-portion 21 and the first gate line G2. The second conductive portion may further include another conductive structure located at another conductive layer, which is connected to the first connection portion, and an orthographic projection of the conductive portion on the base substrate at least partially overlaps with an orthographic projection of the first gate line on the base substrate, such that the conductive portion may also achieve the pull-up effect on the gate of the driving transistor at the end of the compensation stage T2. Moreover, in another exemplary embodiment, the pixel driving circuit may also have other structures and other driving methods.

It should be noted that in the present exemplary embodiment, the orthographic projection of structure A on the base substrate extending along an X direction may be understood as that the orthographic projection of structure A on the base substrate extends along the X direction as a whole, and that is, the orthographic projection of structure A on the base substrate may be bent and extended along the X direction, or may be extended along the X direction in a straight line.

Figure 20:
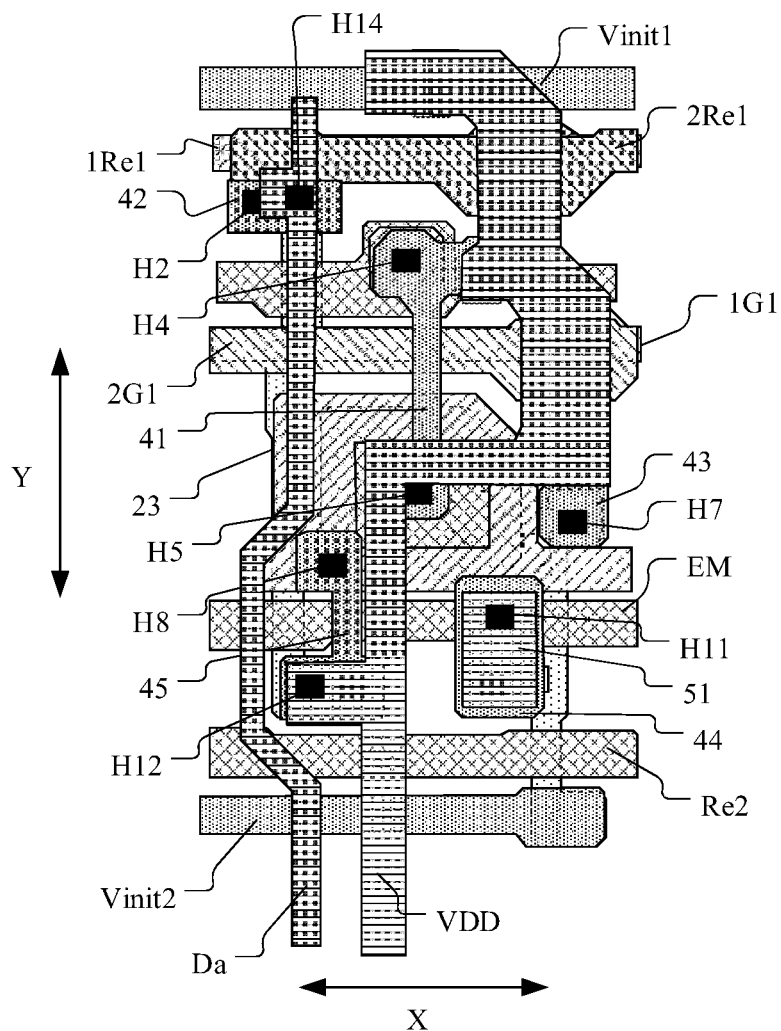
FIG. 20 is a structural layout of an exemplary embodiment of a display panel of the present disclosure.
Figure 21:
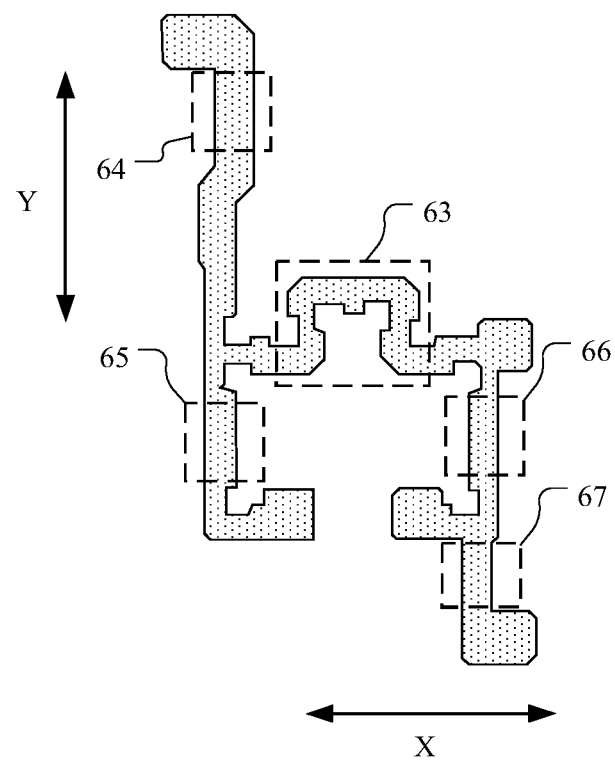
FIG. 21 is a structural layout of the first active layer in FIG. 20.
Figure 22:
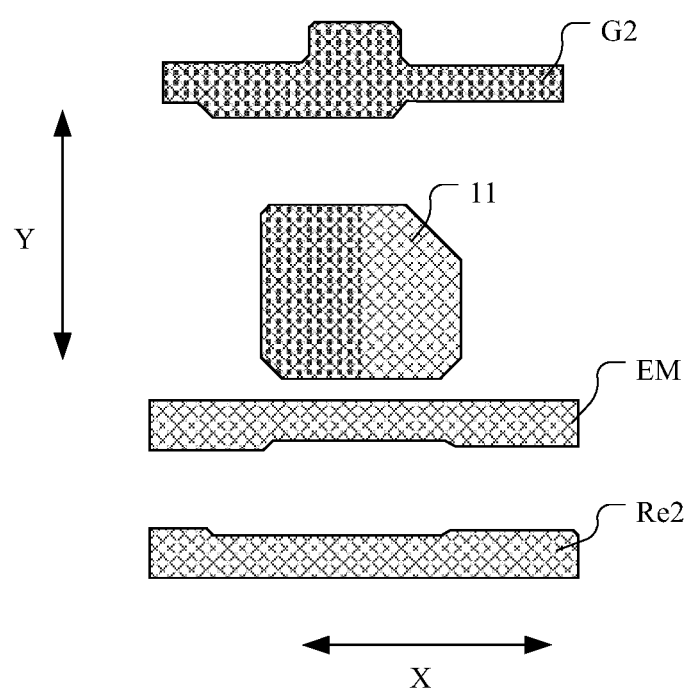
FIG. 22 is a structural layout of the first conductive layer in FIG. 20.
Figure 23:
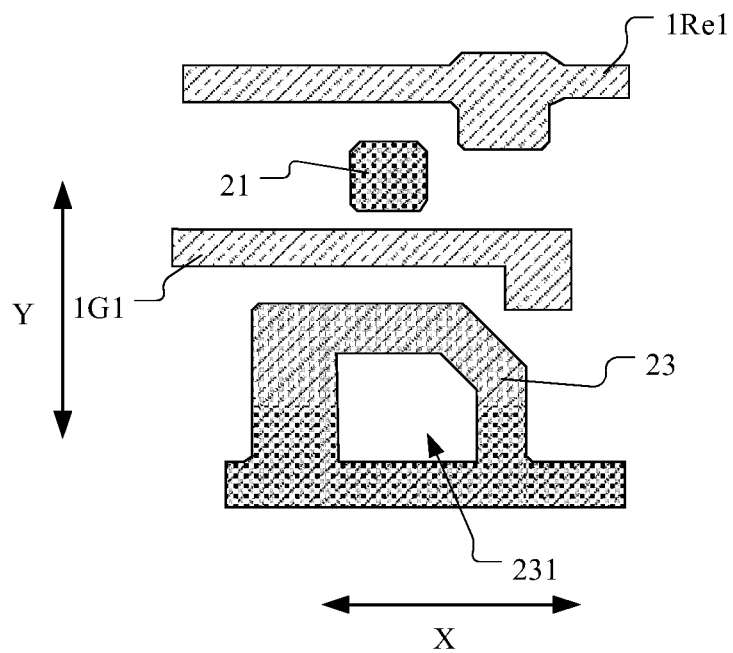
FIG. 23 is a structural layout of the second conductive layer in FIG. 20.
Figure 24:
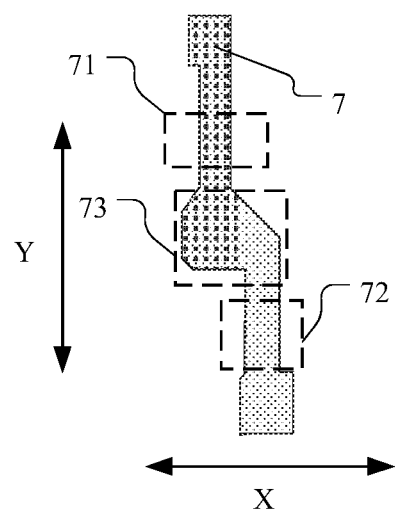
FIG. 24 is a structural layout of the second active layer in FIG. 20.
Figure 25:
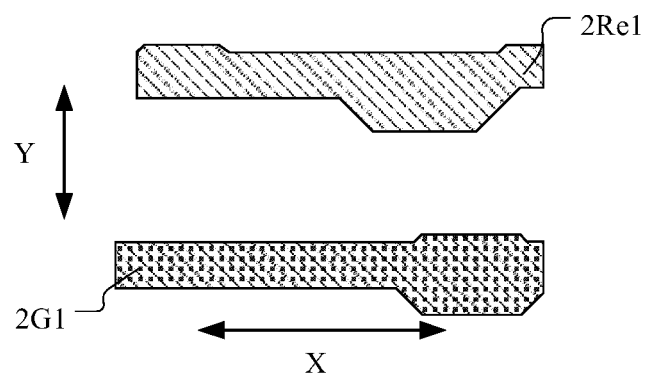
FIG. 25 is a structural layout of the third conductive layer in FIG. 20.
Figure 26:
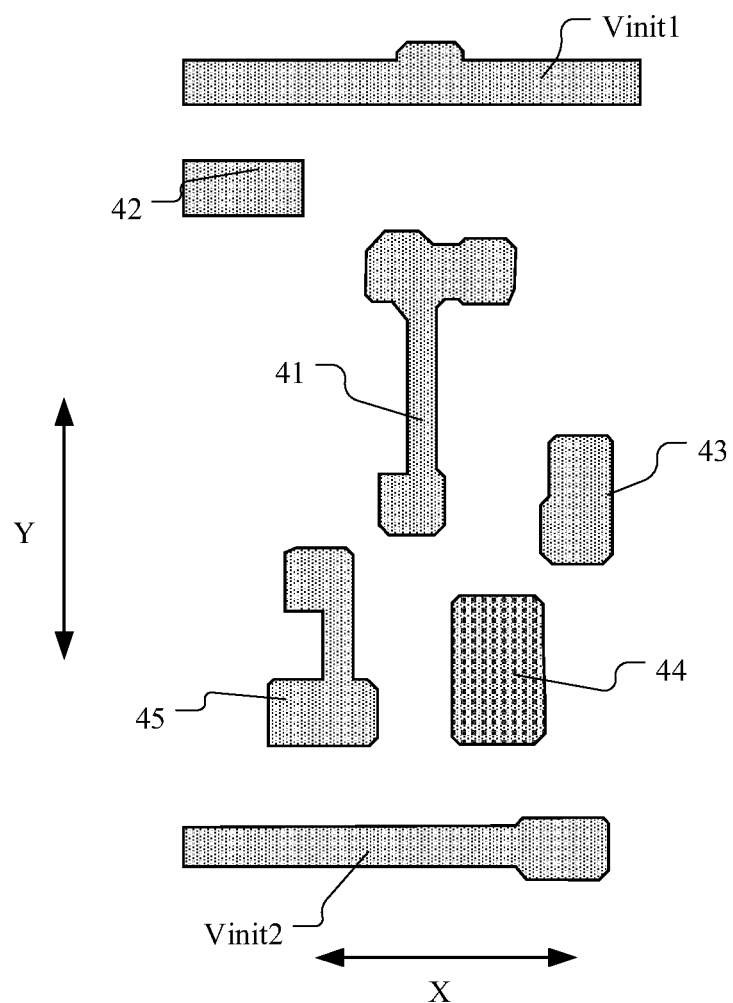
FIG. 26 is a structural layout of the fourth conductive layer in FIG. 20.
Figure 27:
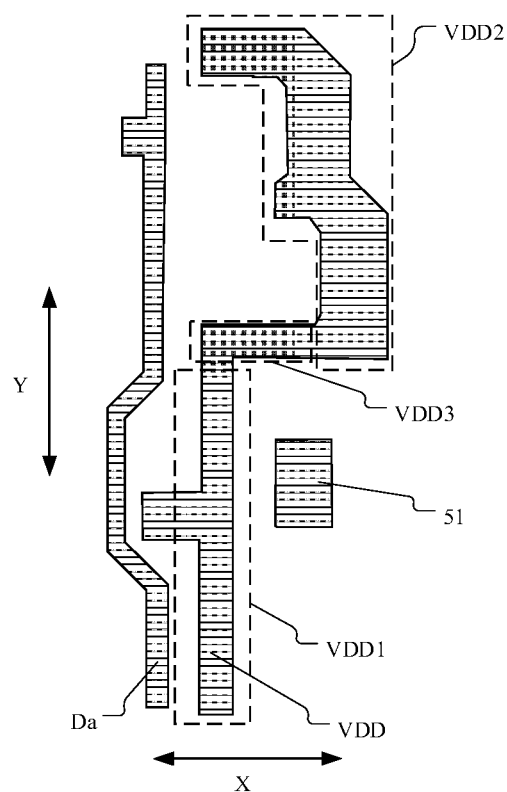
FIG. 27 is a structural layout of the fifth conductive layer in FIG. 20.
Figure 28:
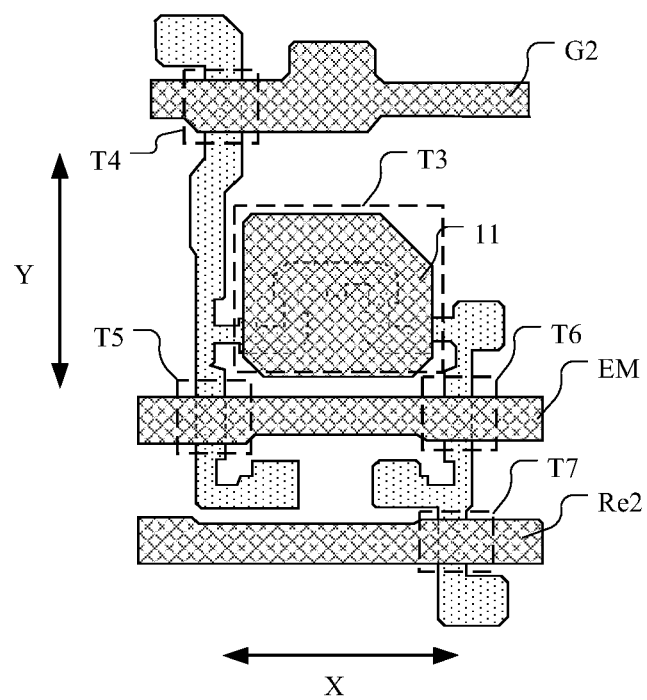
FIG. 28 is a structural layout of the first active layer and the first conductive layer in FIG. 20.
Figure 29:
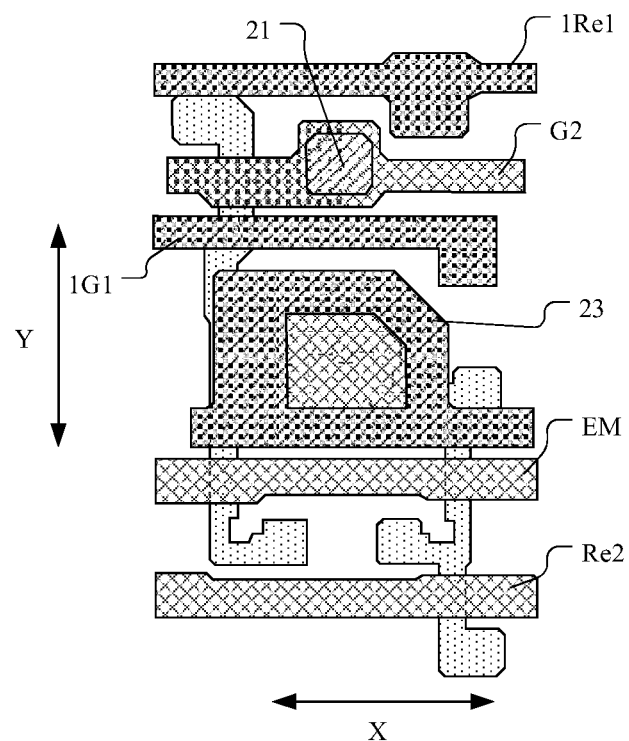
FIG. 29 is a structural layout of the first active layer, the first conductive layer and the second conductive layer in FIG. 20.
Figure 30:
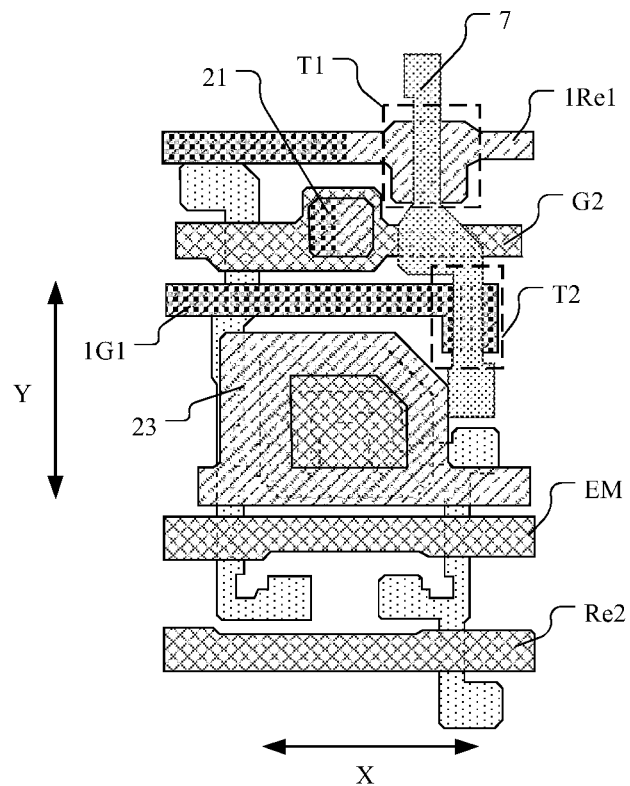
FIG. 30 is a structural layout of the first active layer, the first conductive layer, the second conductive layer and the second active layer in FIG. 20.
Figure 31:
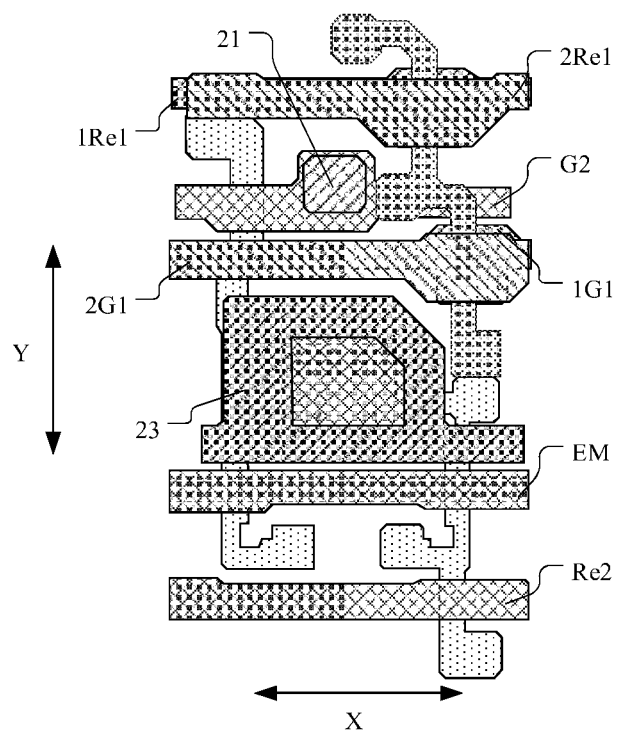
FIG. 31 is a structural layout of the first active layer, the first conductive layer, the second conductive layer, the second active layer and the third conductive layer in FIG. 20.
Figure 32:
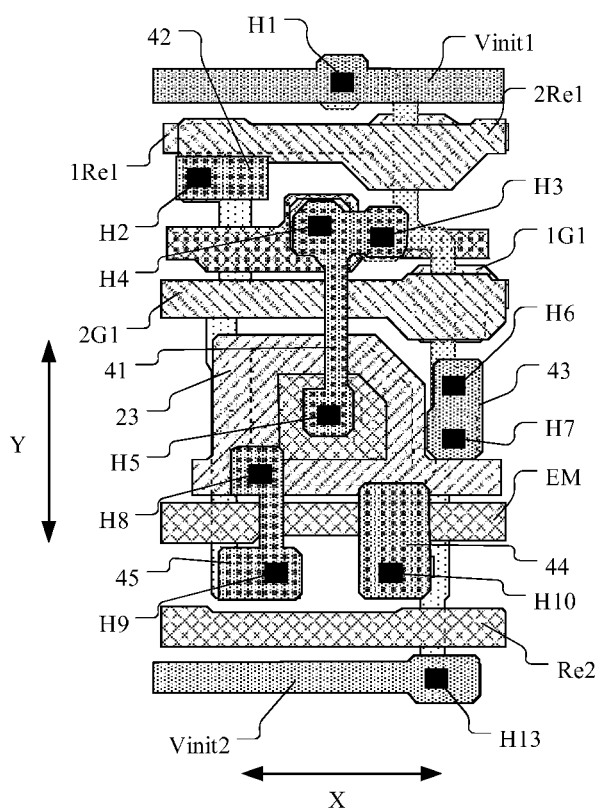
FIG. 32 is a structural layout of the first active layer, the first conductive layer, the second conductive layer, the second active layer, the third conductive layer and the fourth conductive layer in FIG. 20.

The display panel provided by the exemplary embodiment may further include a first active layer, a third conductive layer and a fifth conductive layer, and the base substrate, the first active layer, the first conductive layer, the second conductive layer, the second active layer, the third conductive layer, the fourth conductive layer and the fifth conductive layer may be stacked sequentially. An insulating layer may be arranged between the adjacent layers. The following exemplary embodiment describes an overall structure of the display panel, as shown in FIGS. 20-32. FIG. 20 is a structural layout of an exemplary embodiment of a display panel of the present disclosure; FIG. 21 is a structural layout of the first active layer in FIG. 20; FIG. 22 is a structural layout of the first conductive layer in FIG. 20; FIG. 23 is a structural layout of the second conductive layer in FIG. 20; FIG. 24 is a structural layout of the second active layer in FIG. 20; FIG. 25 is a structural layout of the third conductive layer in FIG. 20; FIG. 26 is a structural layout of the fourth conductive layer in FIG. 20; FIG. 27 is a structural layout of the fifth conductive layer in FIG. 20; FIG. 28 is a structural layout of the first active layer and the first conductive layer in FIG. 20; FIG. 29 is a structural layout of the first active layer, the first conductive layer and the second conductive layer in FIG. 20; FIG. 30 is a structural layout of the first active layer, the first conductive layer, the second conductive layer and the second active layer in FIG. 20; FIG. 31 is a structural layout of the first active layer, the first conductive layer, the second conductive layer, the second active layer and the third conductive layer in FIG. 20; FIG. 32 is a structural layout of the first active layer, the first conductive layer, the second conductive layer, the second active layer, the third conductive layer and the fourth conductive layer in FIG. 20;

As shown in FIGS. 20, 21 and 28, the first active layer may include an active portion 64, an active portion 65, an active portion 66, an active portion 67 and an active portion 63. The active portion 64 is configured to form a channel region of the fourth transistor, the active portion 65 is configured to form a channel region of the fifth transistor, the active portion 66 is configured to form a channel region of the sixth transistor, and the active portion 67 is configured to form a channel region of the seventh transistor, and the active portion 63 is configured to form a channel region of the driving transistor T3. The first active layer may be formed of a polysilicon semiconductor.

As shown in FIGS. 20, 22 and 28, the first conductive layer may further include an enable signal line EM and a second reset signal line Re2. The enable signal line EM is configured to provide the enable signal terminal in FIG. 1, and the second reset signal line Re2 is configured to provide the second reset signal terminal in FIG. 1. Both orthographic projections of the enable signal line EM and the second reset signal line Re2 on the base substrate may extend along the first direction X. The first active layer may be formed by conductorization using the first conductive layer as a mask, and that is, a part shielded by the first conductive layer may be formed as a channel region of the transistor, and a part not shielded by the first conductive layer may be formed as the conductor structure.

As shown in FIGS. 20, 23 and 29, the second conductive layer may further include a third gate line 1Re1 and a third conductive portion 23. The third gate line 1Re1 is configured to provide the first reset signal terminal in FIG. 1, and the third conductive portion 23 may form the other electrode of the capacitor C. An orthographic projection of the third gate line 1Re1 on the base substrate may extend along the first direction X. The third conductive portion 23 may be defined with a first opening 231.

As shown in FIGS. 20, 24 and 30, the second active layer may include a first active portion 7, which may include a first active sub-portion 71, a second active sub-portion 72, and a third active sub-portion 73 connected between the first active sub-portion 71 and the second active sub-portion 72. The first active sub-portion 71 may be configured to form a channel region of the first transistor T1, and the second active sub-portion 72 may be configured to form a channel region of the second transistor T2. The second active layer may be formed of an oxide semiconductor, such as indium gallium zinc oxide.

As shown in FIGS. 20, 25 and 31, the third conductive layer may include a fifth gate line 2Re1 configured to provide the first reset signal terminal in FIG. 1, and a fourth gate line 2G1 configured to provide the first gate driving signal terminal in FIG. 1. Orthographic projections of the fifth gate line 2Re1 and the fourth gate line 2G1 on the base substrate may extend along the first direction X. Any segment of the orthographic projection of the fifth gate line 2Re1 on the base substrate in its extension direction may at least partially overlap with the orthographic projection of the third gate line 1R1 on the base substrate, and any segment of the orthographic projection of the fourth gate line 2G1 on the base substrate in its extension direction may at least partially overlap with the orthographic projection of the second gate line 1G1 on the base substrate. The fifth gate line 2Re1 and the third gate line 1R1 may be connected through a via hole, and the through hole may be located in a non-display region of the display panel. The fourth gate line 2G1 and the second gate line 1G1 may be connected through a via hole, and the through hole may be located in the non-display region of the display panel. The second active layer may be formed by conductorization using the third conductive layer as a mask, and that is, a part shielded by the third conductive layer may be formed as a channel region of the transistor, and a part not shielded by the third conductive layer may be formed as the conductor structure.

As shown in FIGS. 20, 26 and 32, the fourth conductive layer may further include a first initialization signal line Vinit1, a second initialization signal line Vinit2, a connection portion 42, a connection portion 43, a connection portion 44 and a connection portion 45. The first initialization signal line Vinit1 may be configured to provide the first initialization signal terminal in FIG. 1, and the second initialization signal line Vinit2 may be configured to provide the second initialization signal terminal in FIG. 1. The first connection portion 41 may be connected to the first conductive portion 11 through a first via hole H5, the first conductive sub-portion 21 through a via hole H4, and the third active sub-portion 73 through a via hole H3, so as to connect the gate of the driving transistor T3 and the first electrode of the first transistor T1, and connect the gate of the driving transistor T3 and the first electrode of the second transistor T2. An orthographic projection of the first via hole H5 on the base substrate may be located within an orthographic projection of the first opening 231 on the base substrate, and that is, an edge of the orthographic projection of the first via hole H5 on the base substrate is spaced from an edge of the orthographic projection of the first opening 231 on the base substrate, such that the conductive structure in the first via hole H5 is insulated from the third conductive portion 23. The connection portion 42 may be connected to the first active layer on a side of the active portion 64 through a via hole H2, so as to connect the first electrode of the fourth transistor T4. The connection portion 43 may be connected to the first active layer on a side of the active portion 66 through a via hole H7 and the second active layer on the side of the second active sub-portion 72 through a via hole H6, so as to connect the first electrode of the sixth transistor and the second electrode of the second transistor. The connection portion 44 may be connected to the first active layer on a side of the active portion 66 through a via hole H10, so as to connect the second electrode of the sixth transistor. The connection portion 45 may be connected to the first active layer on a side of the active portion 65 through a via hole H9, and the third conductive portion 23 through a via hole H8, so as to connect the capacitor C and the first electrode of the fifth transistor. The first initialization signal line Vinit1 may be connected to the second active layer on a side of the first active sub-portion 71 through a via hole H1, so as to connect the second electrode of the first transistor T1 and the first initialization signal terminal. The second initialization signal line Vinit2 may be connected to the first active layer on a side of the active portion 67 through a via hole H13, so as to connect the second initialization signal terminal and the second electrode of the seventh transistor T7.

As shown in FIGS. 20 and 27, the fifth conductive layer may include a power line VDD, a data line Da, and a connection portion 51. The power line VDD is configured to provide the first power terminal in FIG. 1, and the data line Da is configured to provide the data signal terminal in FIG. 1. The power supply line VDD may be connected to the connection portion 45 through a via hole H12. The data line Da may be connected to the connection portion 42 through a via hole H14, so as to connect the first electrode of the fourth transistor and the data signal terminal. The connection portion 51 may be connected to the connection portion 44 through a via hole H11, and the connection portion 51 may be configured to connect an anode of the light-emitting unit in FIG. 1.

In the present exemplary embodiment, as shown in FIG. 20, an orthographic projection of the power line VDD on the base substrate may extend along a second direction Y, and the orthographic projection of the power line VDD on the base substrate may cover an orthographic projection of the first active portion 7 on the base substrate. Characteristics of the oxide semiconductor are easy to change under light. In the present exemplary embodiment the power line VDD shields the first active portion 7, thereby improving stability of the first transistor T1 and the second transistor T2.

In the present exemplary embodiment, the second active layer may be located between the second conductive layer and the third conductive layer. It should be understood that in another exemplary embodiment, the display panel may not include the third conductive layer, and the second active layer may be located between the first conductive layer and the second conductive layer. Accordingly, the first conductive layer may also be provided with a gate line in parallel with the second gate line 1G1 and a gate line in parallel with the third gate line 1Re1.

In the present exemplary embodiment, the first initialization signal line Vinit1 and the second initialization signal line Vinit2 may output initialization signals with the same voltage or initialization signals with different voltages.

When the first initialization signal line Vinit1 and the second initialization signal line Vinit2 output the initialization signals with the same voltage, the second initialization signal line Vinit2 may be shared as the first initialization signal line Vinit1 in a next row of pixel driving circuits.

In the present exemplary embodiment, as shown in FIGS. 20 and 27, the power line VDD may include a first extension portion VDD1, a second extension portion VDD2, and a third extension portion VDD3. An orthographic projection of the first extension portion VDD1 on the base substrate may extend along the second direction Y, and an orthographic projection of the first extension portion VDD1 on the base substrate may at least partially overlap with the orthographic projection of the first opening 231 on the base substrate. An orthographic projection of at least a partial structure of the second extension portion VDD2 on the base substrate may extend along the second direction Y, and the orthographic projection of the second extension portion VDD2 on the base substrate may cover the first active portion 7. The third extension portion VDD3 may be connected between the first extension portion VDD1 and the second extension portion VDD2, an orthographic projection of the third extension portion VDD3 on the base substrate may extend along the first direction X, and the orthographic projection of the third extension portion VDD3 on the base substrate may at least partially overlap with the orthographic projection of the first opening 231 on the base substrate. The orthographic projection of the first extension portion VDD1 on the base substrate at least partially overlaps with the orthographic projection of the first opening 231 on the base substrate, such that the first extension portion VDD1 may form a parallel-plate capacitor with the first conductive portion 11. This arrangement may not only increase a capacitor value of the capacitor C, and the first extension portion VDD1 may stabilize the voltage of the first conductive portion 11. Similarly, the orthographic projection of the third extension portion VDD3 on the base substrate and the orthographic projection of the first opening 231 on the base substrate at least partially overlap, such that the third extension portion VDD3 may form a parallel-plate capacitor with the first conductive portion 11. This arrangement may not only increase the capacitor value of the capacitor C, and the third extension portion VDD3 may stabilize the voltage of the first conductive portion 11.

As shown in FIG. 3, in the related art, the second transistor T2 as an oxide transistor has a relatively small leakage current, and the second transistor T2 has two gates located in the second conductive layer and the third conductive layer respectively. Compared with a single gate structure of the fourth transistor T4, the second transistor T2 has a higher switching current ratio, lower subthreshold swing and stronger device stability. However, the second transistor T2 has a double-gate structure with a larger channel capacitor. Thus, when a voltage of the gate of the second transistor T2 changes, the voltage of the gate of the second transistor T2 has a relatively long rising edge and falling edge, and that is, when the second transistor T2 is driven, it takes a long time to fully turn on or off the second transistor T2.

As shown in FIG. 20, compared with the display panel shown in FIG. 3, in the present exemplary embodiment, the fourth conductive layer is not provided with the first power line VDD1, and the power line VDD merely is arranged at the fifth conductive layer. This arrangement may reduce a parasitic capacitor between the second gate line 1G1 and the power line, and a parasitic capacitor between the fourth gate line 2G1 and the power line, thereby improving charging speed of the gate of the second transistor T2. In a single pixel driving circuit in FIG. 3, a sum of a parasitic capacitor between the first gate driving signal sub-line and the power line and a parasitic capacitor between the second gate driving signal sub-line and the power line may reach 12 fF. In the single pixel driving circuit of the present exemplary embodiment, a sum of a parasitic capacitor between the second gate line 1G1 and the power line and a parasitic capacitor between the fourth gate line 2G1 and the power line may be reduced to 7.5 fF. It should be noted that this arrangement may also reduce a parasitic capacitor between the gate of the first transistor T1 and the power line, thereby increasing charging speed of the gate of the first transistor T1. In addition, the arrangement may also be used to solve the technical problem of slow charging speeds of the gate of the first transistor and the gate of the second transistor caused by other reasons.

Figure 35:
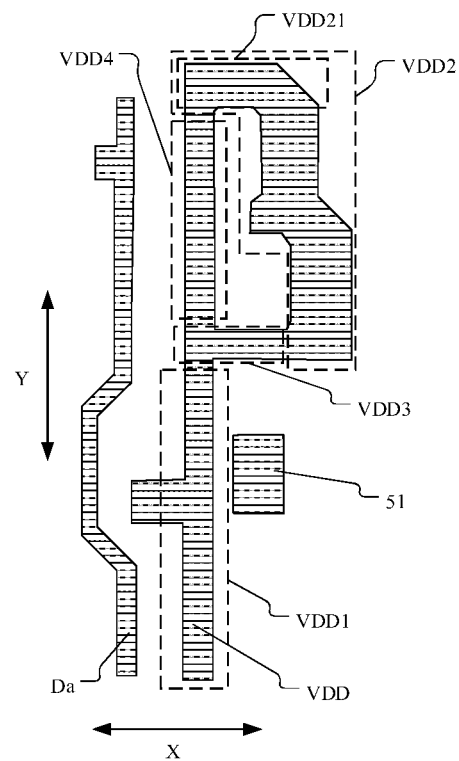
FIG. 35 is a structural layout of the fifth conductive layer in FIG. 33.
Figure 36:
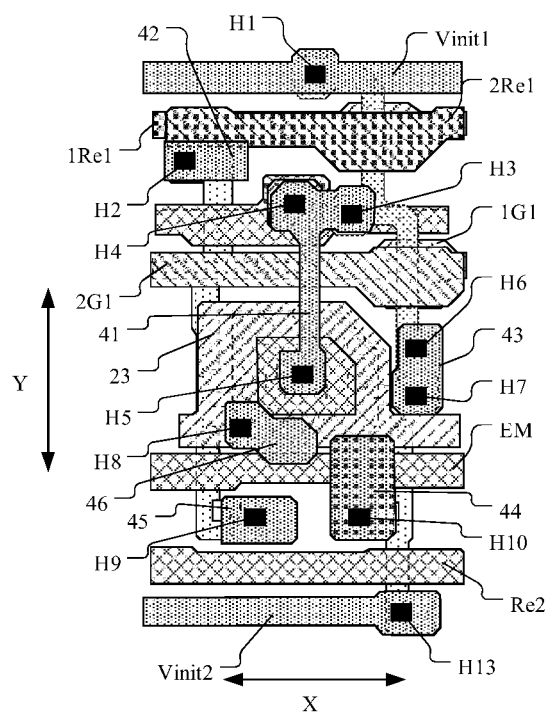
FIG. 36 is a structural layout of the first active layer, the first conductive layer, the second conductive layer, the second active layer, the third conductive layer and the fourth conductive layer in FIG. 33.

In another exemplary embodiment, the fourth conductive layer and the fifth conductive layer may have other structures. For example, as shown in FIGS. 33-36, FIG. 33 is a structural layout of another exemplary embodiment of a display panel of the present disclosure; FIG. 34 is a structural layout of the fourth conductive layer in FIG. 33; FIG. 35 is a structural layout of the fifth conductive layer in FIG. 33; FIG. 36 is a structural layout of the first active layer, the first conductive layer, the second conductive layer, the second active layer, the third conductive layer and the fourth conductive layer in FIG. 33. The structures of the first active layer, the first conductive layer, the second conductive layer, the second active layer and the third conductive layer in the display panel may be the same as that of the display panel in FIG. 20.

Figure 33:
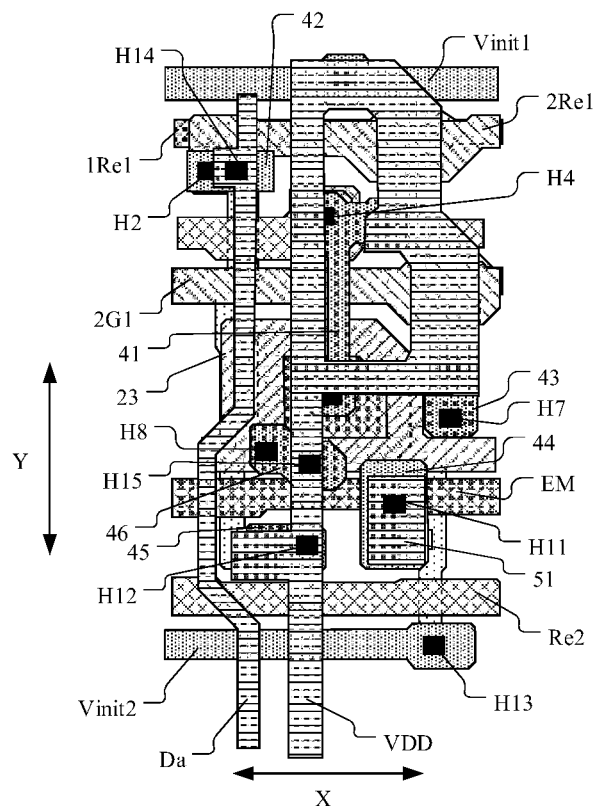
FIG. 33 is a structural layout of another exemplary embodiment of a display panel of the present disclosure.
Figure 34:
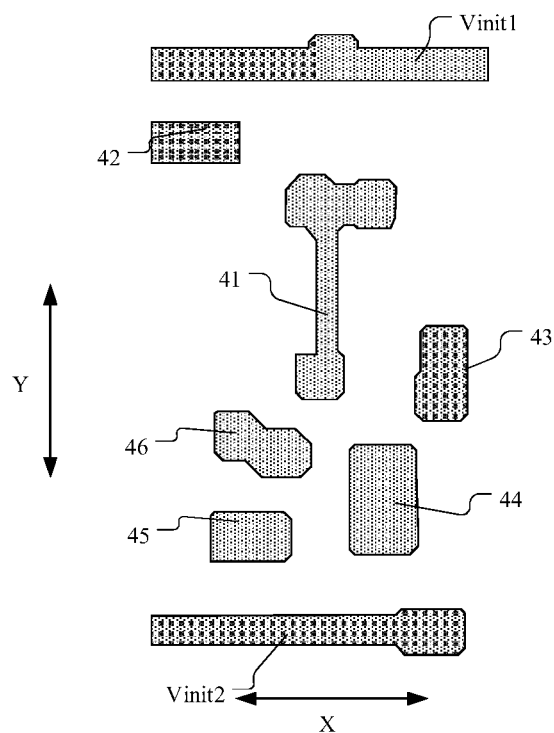
FIG. 34 is a structural layout of the fourth conductive layer in FIG. 33.

As shown in FIGS. 33, 34 and 36, different from the display panel in FIG. 20, in the present exemplary embodiment, the fourth conductive layer may further include a connection portion 46. The connection portion 45 is connected to the first active layer on the side of the active portion 65 through the via hole H9, so as to connect the first electrode of the fifth transistor. The connection portion 46 is connected to the third conductive portion 23 through the via hole H8. As shown in FIGS. 33 and 35, the power line VDD is connected to the connection portion 46 through a via hole H15, so as to connect the third conductive portion 23, and the power line VDD is connected to the connection portion 45 through the via hole H12, so as to connect the first electrode of the fifth transistor and the first power terminal.

As shown in FIG. 35, unlike the display panel in FIG. 20, the power line VDD may further include a fourth extension portion VDD4. The second extension portion VDD2 may include a first extension sub-portion VDD21, and an orthographic projection of the first extension sub-portion VDD21 on the base substrate may extend along the first direction X. An orthographic projection of the fourth extension portion VDD4 on the base substrate may extend along the second direction Y, and the fourth extension portion VDD4 may be connected between the first extension sub-portion VDD21 and the first extension portion VDD1. The third extension portion VDD3, the fourth extension portion VDD4 and the second extension portion VDD2 may form an annular structure. This arrangement may reduce resistance of the power line VDD itself, thereby improving display uniformity of the display panel. As shown in FIG. 33, the orthographic projection of the first extension sub-portion VDD21 on the base substrate may at least partially overlap with an orthographic projection of the first initialization signal line Vinit1 on the base substrate, and this arrangement may increase light transmittance of the display panel. The orthographic projection of the first extension sub-portion VDD21 on the base substrate may at most partially overlap with the orthographic projection of the third gate line 1Re1 on the base substrate. For example, the orthographic projection of the first extension sub-portion VDD21 on the base substrate may not overlap with the orthographic projection of the third gate line 1Re1 on the base substrate.

As shown in FIGS. 20 and 33, an overlapping area of the orthographic projection of the power line VDD on the base substrate and an orthographic projection of the first connection portion 41 on the base substrate may be less than 70% of an area of the orthographic projection of the first connection portion 41 on the base substrate. For example, The overlapping area of the orthographic projection of the power line VDD on the base substrate and the orthographic projection of the first connection portion 41 on the base substrate may be equal to 5%, 10%, 20%, 30%, 40%, 50%, 60% of the area of the orthographic projection of the first connection portion 41 on the base substrate.

Figure 39:
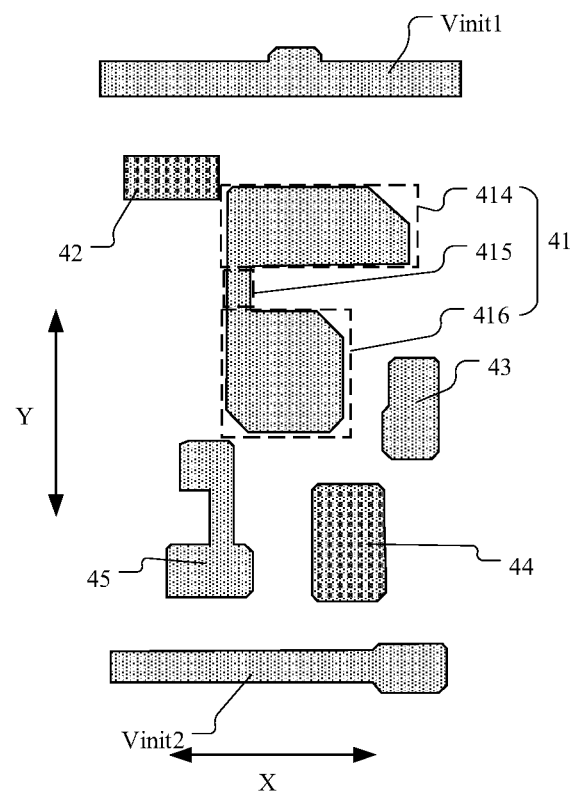
FIG. 39 is a structural layout of the fourth conductive layer in FIG. 37.
Figure 40:
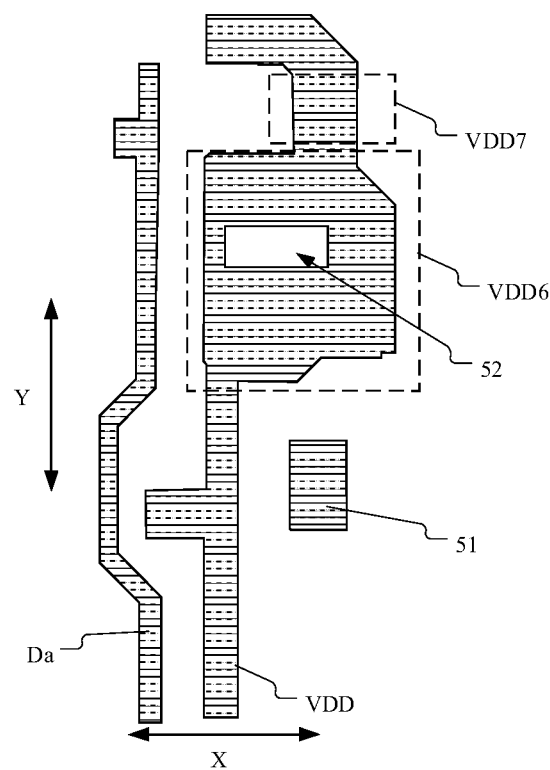
FIG. 40 is a structural layout of the fifth conductive layer in FIG. 37.
Figure 41:
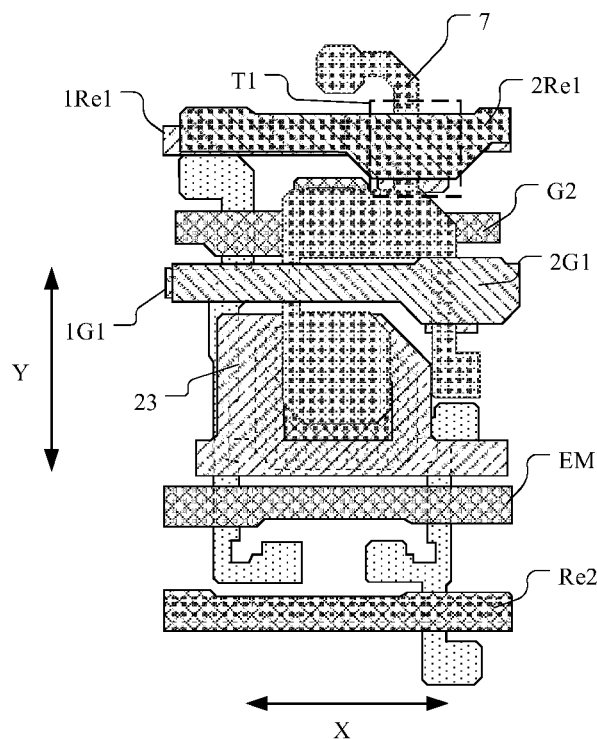
FIG. 41 is a structural layout of the first active layer, the first conductive layer, the second conductive layer and the second active layer in FIG. 37.
Figure 42:
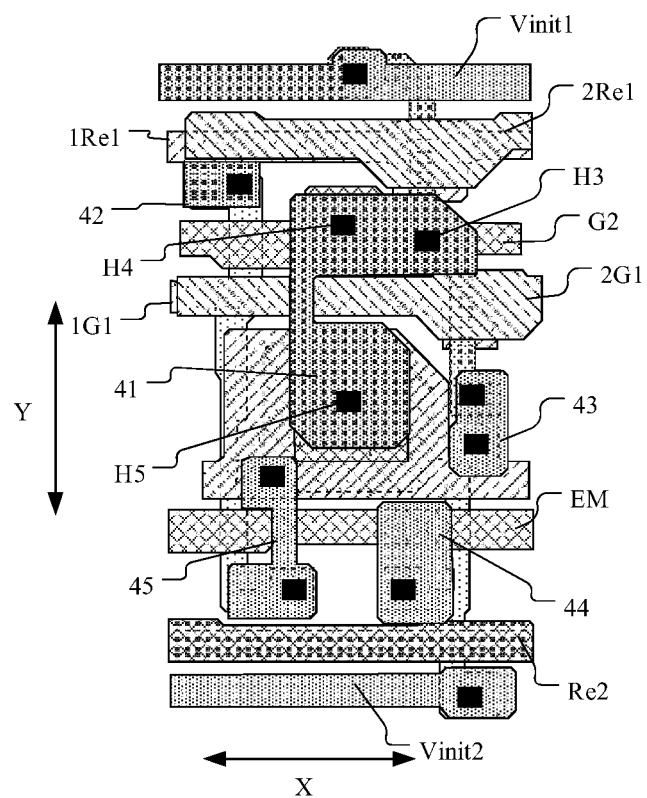
FIG. 42 is a structural layout of the first active layer, the first conductive layer, the second conductive layer, the second active layer, the third conductive layer and the fourth conductive layer in FIG. 37.

In another exemplary embodiment, the second active layer, the fourth conductive layer, and the fifth conductive layer may have other structures. For example, as shown in FIG. 37-42, FIG. 37 is a structural layout of another exemplary embodiment of a display panel of the present disclosure; FIG. 38 is a structural layout of the second active layer in FIG. 37; FIG. 39 is a structural layout of the fourth conductive layer in FIG. 37; FIG. 40 is a structural layout of the fifth conductive layer in FIG. 37; FIG. 41 is a structural layout of the first active layer, the first conductive layer, the second conductive layer and the second active layer in FIG. 37; FIG. 42 is a structural layout of the first active layer, the first conductive layer, the second conductive layer, the second active layer, the third conductive layer and the fourth conductive layer in FIG. 37. The structure of the first active layer, the first conductive layer, the second conductive layer and the third conductive layer in the display panel may be the same as that of the display panel in FIG. 20.

Figure 37:
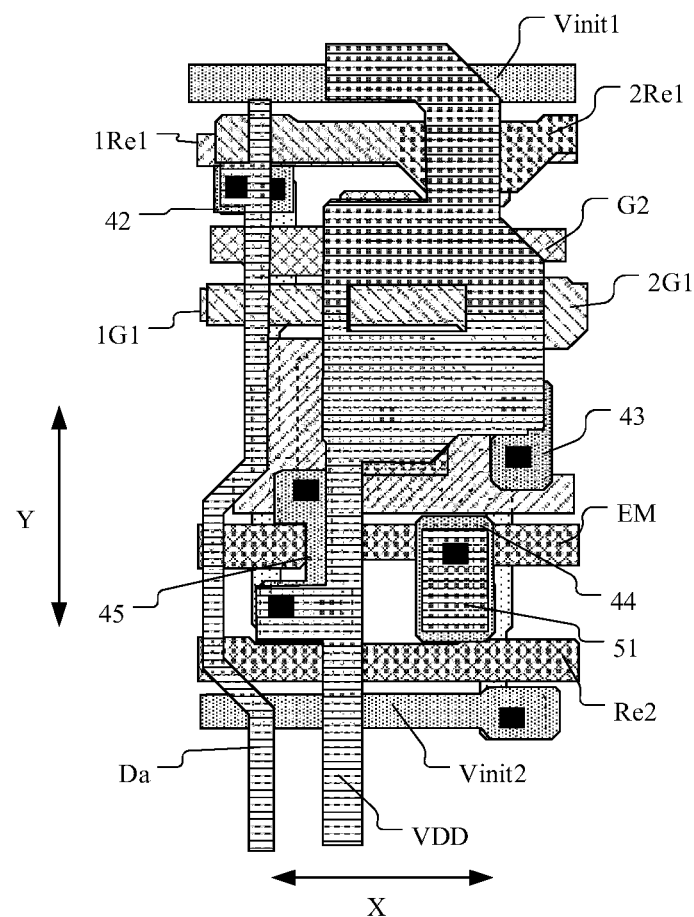
FIG. 37 is a structural layout of another exemplary embodiment of a display panel of the present disclosure.
Figure 38:
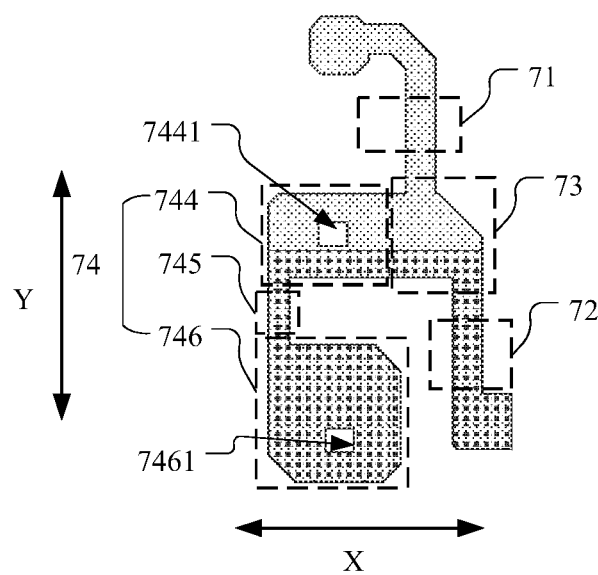
FIG. 38 is a structural layout of the second active layer in FIG. 37.

As shown in FIGS. 37, 38 and 41, different from the display panel shown in FIG. 20, in the present exemplary embodiment, the second conductive portion may further include a second active portion 74, which may be formed in the same layer as the second active layer, and that is, the second active portion 74 is located at the second active layer. An orthographic projection of the second active portion 74 on the base substrate may at least partially overlap with the orthographic projection of the first gate line G2 on the base substrate, and the second active portion 74 is electrically connected to the first connection portion 41.

In the present exemplary embodiment, the second active portion 74 is further provided at the second active layer, and the second active portion 74 may form a parallel-plate capacitor with the first gate line G2. The first gate line G2 has a certain coupling effect on the second active portion 74. Since the second active portion 74 is connected to the gate of the driving transistor (the first conductive portion 11) through the first connection portion 41, this arrangement may increase the coupling effect of the first gate line G2 on the gate of the driving transistor (the first conductive portion 11), and that is, at the end of the compensation stage T2, the first gate line G2 has a pull-up effect on the gate of the driving transistor (the first conductive portion 11). On the one hand, the combined action of the first gate line G2 and the second active portion 74 may counteract the pull-down effect of the second gate line 1G1 on the gate of the driving transistor (the first conductive portion 11), so as to keep a voltage of the gate of the driving transistor unchanged at the end of the compensation stage. On the other hand, the combined action of the first gate line G2 and the second active portion 74 may also increase the voltage of the gate of the driving transistor at the end of the compensation stage, thereby reducing a voltage of a data signal to be provided at the data signal terminal when the display panel is black, which reduces the power of a source driving circuit.

In the present exemplary embodiment, as shown in FIG. 41, the orthographic projection of the third gate line 1Re1 on the base substrate may be located at a side of the orthographic projection of the first gate line G2 on the base substrate away from the orthographic projection of the second gate line 1G1 on the base substrate, such that the orthographic projection of the third active sub-portion 73 on the base substrate may at least partially overlap with the orthographic projection of the first gate line G2 on the base substrate. Since the third active sub-portion 73 is connected to the first connection portion 41, this arrangement may further enhance the pull-up effect of the first gate line on the gate of the driving transistor at the end of the compensation stage through the third active sub-portion 73.

In the present exemplary embodiment, as shown in FIG. 38, the second active portion 74 may be connected to the third active sub-portion 73. An overlapping area of the orthographic projection of the second active portion 73 on the base substrate and the orthographic projection of the second gate line 1G1 on the base substrate may be less than 50% of an area of the orthographic projection of the second active portion 74 on the base substrate. For example, the overlapping area of the orthographic projection of the second active portion 73 on the base substrate and the orthographic projection of the second gate line 1G1 on the base substrate may be equal to 1%, 2%, 3%, 4%, 5%, 7%, 10%, 20%, 30%, 40% of the area of the orthographic projection of the second active portion 74 on the base substrate. The second active portion may include a fourth active sub-portion 744, a fifth active sub-portion 745, and a sixth active sub-portion 746. The fourth active sub-portion 744 may be connected to the third active sub-portion 73, and an orthographic projection of the fourth active sub-portion 744 on the base substrate may extend along the first direction X, and the orthographic projection of the fourth active sub-portion 744 on the base substrate may at least partially overlap with the orthographic projection of the first gate line G1 on the base substrate. The fifth active sub-portion 745 may be connected to the fourth active sub-portion, an orthographic projection of the fifth active sub-portion 745 on the base substrate may extend along the second direction Y, the orthographic projection of the fifth active sub-portion 745 on the base substrate may intersect with the orthographic projection of the second gate line 1G1 on the base substrate, and the orthographic projection of the fifth active sub-portion 745 on the base substrate may intersect the orthographic projection of the fourth gate line 2G1 on the base substrate. The sixth active sub-portion 746 may be connected to the fifth active sub-portion 745, and an orthographic projection of the sixth active sub-portion 746 on the base substrate may at least partially overlap with the orthographic projection of the third conductive portion 23 on the base substrate. The orthographic projection of the fourth active sub-portion 744 on the base substrate at least partially overlaps with the orthographic projection of the first gate line G1 on the base substrate, thereby reducing the light-shading effect of the fourth active sub-portion 744 on the display panel and improving the light transmittance of the display panel. In addition, the orthographic projection of the sixth active sub-portion 746 on the base substrate at least partially overlaps with the orthographic projection of the third conductive portion on the base substrate, such that a parallel-plate capacitor may be formed between the sixth active sub-portion 746 and the third conductive portion 23, and this arrangement may increase the capacitor value of the capacitor C.

In the present exemplary embodiment, as shown in FIG. 38, a size of the orthographic projection of the fifth active sub-portion 745 on the base substrate in the first direction X may be smaller than a size of the orthographic projection of the sixth active sub-portion 746 on the base substrate in the first direction X. This arrangement may minimize a parasitic capacitor between the second gate line 1G1 and the fifth active sub-portion 745, and a parasitic capacitor between the fourth gate line 2G1 and the fifth active sub-portion 745, thereby improving charging speed of the second gate line 1G1.

In the present exemplary embodiment, since the second transistor has a double-gate structure, the second gate line 1G1 and the fourth gate line 2G1 form a large capacitor with other structures, and charging speed of the gate of the second transistor is slower than that of the gate of the fourth transistor. In the present exemplary embodiment, as shown in FIG. 38, an overlapping area of the orthographic projection of the fourth active sub-portion 744 on the base substrate and the orthographic projection of the first gate line G2 on the base substrate may be S1, and an overlapping area of the orthographic projection of the fifth active sub-portion 745 on the base substrate and the orthographic projection of the second gate line 1G1 on the base substrate is S2, an overlapping area of the orthographic projection of the fifth active sub-portion 745 on the base substrate and the orthographic projection of the fourth gate line 2G1 on the base substrate is S3, S1 may be greater than S2 and S1 may be greater than S3. In the present exemplary embodiment, the charging speed of the gate of the second transistor may be compensated by overlapping area difference of the projection, such that the second transistor and the fourth transistor have similar or the same response speed in the compensation stage.

In the present exemplary embodiment, as shown in FIGS. 37, 39 and 42, different from the display panel shown in FIG. 20, the first connection portion 41 may include a fourth conductive portion 414, a fifth conductive portion 415 and a sixth conductive portion 416, and the fourth conductive portion 414 may be connected to the third active sub-portion 73 through a via hole H3, an orthographic projection of the fourth conductive portion 414 on the base substrate may cover the orthographic projection of the fourth active sub-portion 744 on the base substrate, and the orthographic projection of the fourth conductive portion 414 on the base substrate may at least partially overlap with the orthographic projection of the first gate line G2 on the base substrate. The fifth conductive portion 415 may be connected to the fourth conductive portion 414, an orthographic projection of the fifth conductive portion 415 on the base substrate may cover the orthographic projection of the fifth active sub-portion 745 on the base substrate, and the orthographic projection of the fifth conductive portion 415 on the base substrate may also overlap with the orthographic projection of the second gate line 1G1 on the base substrate. The sixth conductive portion 416 may be connected to the fifth conductive portion 415, an orthographic projection of the sixth conductive portion 416 on the base substrate may cover the orthographic projection of the sixth active sub-portion 746 on the base substrate, and the orthographic projection of the sixth conductive portion 416 on the base substrate may at least partially overlap with the orthographic projection of the third conductive portion on the base substrate. A size of the orthographic projection of the fifth conductive portion 415 on the base substrate in the first direction X may be smaller than a size of the orthographic projection of the sixth conductive portion 416 on the base substrate in the first direction X. On the one hand, the first connection portion 41 may shade light for the second active portion 74; On the other hand, a parallel-plate capacitor may also be formed between the first connection portion 41 and the third conductive portion 23 to further increase the capacitor value of the capacitor C.

In the embodiment of the present disclosure, referring to FIGS. 39 and 42, the parallel-plate capacitor may be formed only between the first connection portion 41 and the third conductive portion 23, while the second active layer may be arranged referring to FIG. 24, and the first connection portion 41 may be electrically connected to the third active sub-portion 73 through the via hole H3, so as to meet the capacitor value under a different requirement.

As shown in FIGS. 38 and 42, the first connection portion 41 may be connected to the first conductive sub-portion 21 through the via hole H4, such that an opening 7441 is defined on the fourth active sub-portion 744. The first connection portion 41 may be connected to the first conductive portion 11 through the via hole H5, such that an opening 7461 is defined on the sixth active sub-portion 746.

In the present exemplary embodiment, as shown in FIGS. 37 and 40, the power line VDD may include a sixth extension portion VDD6 and a seventh extension portion VDD7, which are different from the display panel shown in FIG. 20. A size of an orthographic projection of the sixth extension portion VDD6 on the base substrate in the first direction X may be larger than a size of an orthographic projection of the seventh extension portion VDD7 on the base substrate in the first direction X, and the orthographic projection of the sixth extension portion VDD6 on the base substrate may cover the orthographic projection of the second active portion 74 on the base substrate. The sixth extension portion VDD6 may form a parallel-plate capacitor with the second active portion 74, such that the capacitor value of the capacitor C may be further increased. In addition, the sixth extension portion VDD6 may form a parallel-plate capacitor with the first connection portion 41 to increase the capacitor value of the capacitor C. As shown in FIG. 40, the sixth extension portion VDD6 may be defined with a second opening 52, and an orthographic projection of the second opening 52 on the base substrate may at least partially overlap with the orthographic projection of the second gate line 1G1 on the base substrate, The orthographic projection of the second opening 52 on the base substrate may at least partially overlap with the orthographic projection of the fourth gate line 2G1 on the base substrate. As shown in FIG. 40, the second opening 52 may be a closed figure, and that is, the orthographic projection of the second opening 52 on the base substrate is located within the orthographic projection of the sixth extension portion VDD6 on the base substrate. It should be understood that in another exemplary embodiment, the second opening 52 may also be a non-closed figure. For example, the second opening 52 may be a notch located at an edge of the sixth extension portion VDD6. In the present exemplary embodiment, the second opening 52 is defined on the sixth extension portion VDD6, such that a parasitic capacitor between the sixth extension portion VDD6 and the second gate line 1G1 may be reduced, and a parasitic capacitor between the sixth extension portion VDD6 and the fourth gate line 2G1 may be reduced, thereby further increasing the charging speed of the gate of the second transistor. In the single pixel driving circuit of the present exemplary embodiment, a sum of a parasitic capacitor between the second gate line 1G1 and the power line and a parasitic capacitor between the fourth gate line 2G1 and the power line may be reduced to 7.7 fF.

Figure 43:
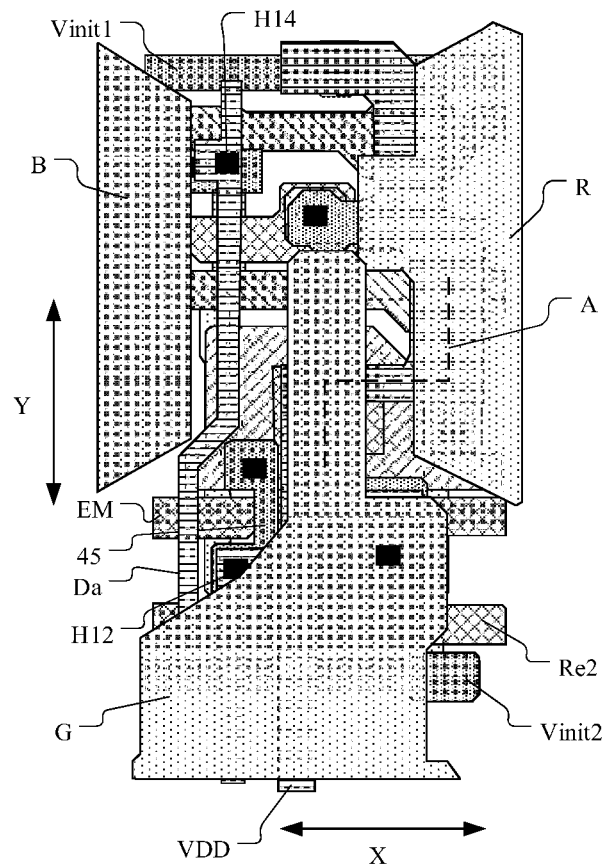
FIG. 43 is a structural layout of another exemplary embodiment of a display panel of the present disclosure.

FIG. 43 is a structural layout of another exemplary embodiment of a display panel of the present disclosure. On the basis of the display panel shown in FIG. 20, the display panel may further include an anode layer, the anode layer may include a plurality of anode portions, and the plurality of anode portions may be configured to form anodes of light-emitting units respectively. Orthographic projections of the anode portions on the base substrate cover the orthographic projection of the first active portion 7 on the base substrate. The anode portion may further have the light-shading effect on the first active portion 7. As shown in FIG. 43, the display panel may have a RGGB structure, and that is, the anode layer may include a plurality of red anode portions R, a plurality of blue anode portions B, and a plurality of green anode portions G. FIG. 43 only shows a partial structure of the anode portions R, the anode portions B, and the anode portions G. As shown in FIG. 43, the orthographic projection of the anode portions R on the base substrate covers the orthographic projection of the first active portion 7 on the base substrate in the pixel driving circuit. An orthographic projection of the anode portions B on the base substrate may cover the orthographic projection of the first active portion on the base substrate in the pixel driving circuit on a left side of the pixel driving circuit. An orthographic projection of the anode portions G on the base substrate may cover the orthographic projection of the first active portion on the base substrate in the pixel driving circuit on a lower side of the pixel driving circuit. As shown in FIG. 43, the orthographic projection of the anode portions G on the base substrate may also at least partially overlap with the orthographic projection of the first connection portion 41 on the base substrate. Since the voltage of the anode portions G is stable in the light-emitting stage, the anode portions G may stabilize a voltage of the first connection portion 41 by the coupling effect.

Figure 44:
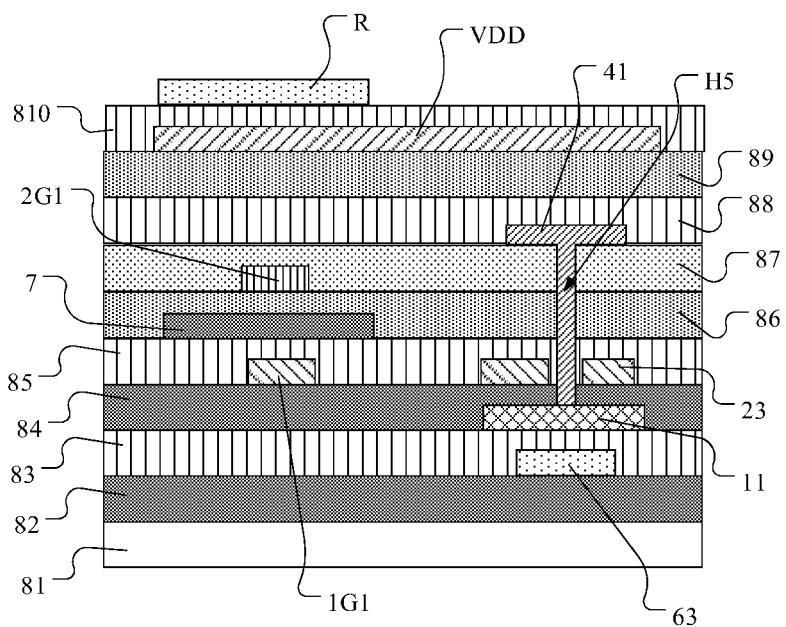
FIG. 44 is a partially sectional view along a dotted line A in FIG. 43.

FIG. 44 shows a partial sectional view along a dotted line A in FIG. 43. The display panel may further include a buffer layer 82, a second insulating layer 83, a third insulating layer 84, a fourth insulating layer 85, a fifth insulating layer 86, a dielectric layer 87, a passivation layer 88, a first planarization layer 89, and a second planarization layer 810. The base substrate 81, the buffer layer 82, the first active layer, the second insulating layer 83, the first conductive layer, the third insulating layer 84, the second conductive layer, the fourth insulating layer 85, the second active layer, the fifth insulating layer 86, the third conductive layer, the dielectric layer 87, the fourth conductive layer, the passivation layer 88, the first planarization layer 89, the fifth conductive layer, the second planarization layer 810, and the anode layer are stacked sequentially. The buffer layer 82 may include at least one of a silicon oxide layer and a silicon nitride layer. The second insulating layer 83 may be a silicon oxide layer. The third insulating layer 84 may be a silicon nitride layer. The fourth insulating layer 85 may include a silicon oxide layer and a silicon nitride layer. The fifth insulating layer 86 may be a silicon oxide layer. The dielectric layer 87 may include a silicon oxide layer and a silicon nitride layer. Materials of the first planarization layer and the second planarization layer may be organic material, such as polyimide (PI), polyethylene terephthalate (PET), polyethylene naphthalate (PEN), silicon glass bonding structure (SOG), and the like. The anode layer may be formed of indium tin oxide (ITO) material. Materials of the fourth conductive layer and the fifth conductive layer may include metal material, such as one of molybdenum, aluminum, copper, titanium, niobium, or an alloy, or a molybdenum/titanium alloy or a laminated layer, or a titanium/aluminum/titanium laminated layer. Materials of the first conductive layer, the second conductive layer and the third conductive layer may be one of molybdenum, aluminum, copper, titanium, niobium or an alloy, or a molybdenum/titanium alloy or a laminated layer.

In the embodiment of the present disclosure, referring to FIG. 44, a capacitor value between the first connection portion 41 and the power line VDD may be adjusted by adjusting a thickness of at least one of the passivation layer 88 and the first planarization layer 89. For example, the thickness of the first planarization layer 89 may be reduced to ⅘ to ⅕ of the second planarization layer 810. For example, the thickness of the first planarization layer 89 may be reduced to ½ of the thickness of a second planarization layer, so as to increase the capacitor value between the first connection portion 41 and the power line VDD.

In the embodiment of the present disclosure, referring to FIG. 44, the passivation layer 88 may also be omitted to save the manufacturing process.

The present exemplary embodiment also provides a display device including the above described display panel. The display device may be a display device such as a mobile phone, a tablet computer, a television, and the like.

After considering the specification and practicing the content disclosed herein, other embodiments of the present disclosure will be apparent to those skilled in the art. The present application is intended to cover any variations, uses, or adaptations of the present disclosure, which follow the general principles of the present disclosure and include common general knowledge or conventional technical means in the art that are not disclosed in the present disclosure. The specification and embodiments are only considered as exemplary, and the true scope and spirit of the present disclosure are pointed out by the claims.

It should be understood that the present disclosure is not limited to the precise structure that has been described above and shown in the drawings, and various modifications and changes may be made without departing from the scope of the present disclosure. The scope of the disclosure is only defined by the appended claims.

What is claimed is:

1. A display panel, wherein the display panel comprises a pixel driving circuit, the pixel driving circuit comprises a driving transistor, a second transistor and a fourth transistor, the second transistor is provided with a first electrode connected to a gate of the driving transistor and a second electrode connected to a second electrode of the driving transistor, the fourth transistor is provided with a first electrode connected to a data line and a second electrode connected to a first electrode of the driving transistor, the driving transistor and the fourth transistor are P-type transistors, the second transistor is an N-type transistor, the display panel further comprises:
 a base substrate;
 a first conductive layer located at a side of the base substrate and comprising: a first gate line and a first conductive portion, an orthographic projection of the first gate line on the base substrate extending along a first direction, a partial structure of the first gate line being configured to form a gate of the fourth transistor, and the first conductive portion being configured to form the gate of the driving transistor;

a second conductive layer located at the side of the base substrate and comprising a second gate line, an orthographic projection of the second gate line on the base substrate extending along the first direction, and a partial structure of the second gate line being configured to form a first gate of the second transistor, and the orthographic projection of the second gate line on the base substrate being located between an orthographic projection of the first conductive portion on the base substrate and the orthographic projection of the first gate line on the base substrate;

a second conductive portion, an orthographic projection of the second conductive portion on the base substrate at least partially overlapping with the orthographic projection of the first gate line on the base substrate;

a fourth conductive layer located at the side of the base substrate and comprising a first connection portion connected to the first conductive portion and the second conductive portion respectively through a via hole.

2. The display panel according to claim 1, wherein the second conductive layer is located at a side of the first conductive layer away from the base substrate, and the fourth conductive layer is located at a side of the second conductive layer away from the base substrate.

3. The display panel according to claim 2, wherein
the second conductive portion comprises a first conductive sub-portion formed in a same layer as the second conductive layer, an orthographic projection of the first conductive sub-portion on the base substrate at least partially overlaps with the orthographic projection of the first gate line on the base substrate, and the first connection portion is connected to the first conductive sub-portion through a via hole.

4. The display panel according to claim 2, wherein the pixel driving circuit further comprises a first transistor provided with a first electrode connected to the gate of the driving transistor and a second electrode connected to a first initialization signal line, and the display panel further comprises:

a second active layer located at the side of the base substrate and comprising a first active portion, wherein a partial structure of the first active portion is configured to form channel regions of the first transistor and the second transistor;

the display panel further comprises a fifth conductive layer located at a side of the second active layer away from the base substrate and comprising:

a power line, wherein an orthographic projection of the power line on the base substrate extends along a second direction and covers an orthographic projection of the first active portion on the base substrate, and an overlapping area of the orthographic projection of the power line on the base substrate and an orthographic projection of the first connection portion on the base substrate is less than 70% of an area of the orthographic projection of the first connection portion on the base substrate.

5. The display panel according to claim 4, wherein the second active layer is located between the second conductive layer and the fourth conductive layer, and the fifth conductive layer is located at a side of the fourth conductive layer away from the base substrate.

6. The display panel according to claim 4, wherein the pixel driving circuit further comprises a capacitor connected between the gate of the driving transistor and the power line, the first conductive portion is further configured to form an electrode of the capacitor, and the second conductive layer further comprises:

a third conductive portion configured to form another electrode of the capacitor, wherein an orthographic projection of the third conductive portion on the base substrate at least partially overlaps with the orthographic projection of the first conductive portion on the base substrate, and the third conductive portion is defined with a first opening, wherein the first connection portion is connected to the first conductive portion through a first via hole, an orthographic projection of the first via hole on the base substrate is located within an orthographic projection of the first opening on the base substrate;

the power line comprises:

a first extension portion, wherein an orthographic projection of the first extension portion on the base substrate extends along the second direction and at least partially overlaps with the orthographic projection of the first opening on the base substrate;

a second extension portion, wherein an orthographic projection of at least a partial structure of the second extension portion on the base substrate extends along the second direction, and the orthographic projection of the second extension portion on the base substrate covers the orthographic projection of the first active portion on the base substrate;

a third extension portion connected between the first extension portion and the second extension portion, wherein an orthographic projection of the third extension portion on the base substrate extends along the first direction and at least partially overlaps with the orthographic projection of the first opening on the base substrate.

7. The display panel according to claim 6, wherein,
the second extension portion comprises a first extension sub-portion, and an orthographic projection of the first extension sub-portion on the base substrate extends along the first direction;

the second conductive layer further comprises:
a third gate line, a partial structure of the third gate line is configured to form a first gate of the first transistor;
the orthographic projection of the first extension sub-portion on the base substrate at most partially overlaps with an orthographic projection of the third gate line on the base substrate.

8. The display panel according to claim 7, wherein the fourth conductive layer further comprises:

the first initialization signal line, wherein an orthographic projection of the first initialization signal line on the base substrate extends along the first direction, and the first initialization signal line is configured to provide a first initialization signal;

the orthographic projection of the first extension sub-portion on the base substrate at least partially overlaps with the orthographic projection of the first initialization signal line on the base substrate.

9. The display panel according to claim 2, wherein the display panel further comprises: a second active layer located between the second conductive layer and the fourth conductive layer;

the second conductive portion comprises a second active portion formed in a same layer as the second active layer, an orthographic projection of the second active portion on the base substrate at least partially overlaps with the orthographic projection of the first gate line on the base substrate, and the second active portion is electrically connected to the first connection portion.

10. The display panel according to claim 9, wherein the pixel driving circuit further comprises a first transistor, the first transistor is provided with a first electrode connected to the gate of the driving transistor and a second electrode connected to a first initialization signal line;
the second conductive layer further comprises:
a third gate line, wherein a partial structure of the third gate line is configured to form a first gate of the first transistor, and an orthographic projection of the third gate line on the base substrate extends along the first direction and is located at a side of the orthographic projection of the first gate line on the base substrate away from the orthographic projection of the second gate line on the base substrate;
the second active layer comprises a first active portion comprising a first active sub-portion, a second active sub-portion, and a third active sub-portion connected between the first active sub-portion and the second active sub-portion;
wherein the first active sub-portion is configured to form a channel region of the first transistor, the second active sub-portion is configured to form a channel region of the second transistor, and the first connection portion is connected to the third active sub-portion through a via hole, and an orthographic projection of the third active sub-portion on the base substrate at least partially overlaps with the orthographic projection of the first gate line on the base substrate.

11. The display panel according to claim 10, wherein an overlapping area of the orthographic projection of the second active portion on the base substrate and the orthographic projection of the second gate line on the base substrate is less than 50% of an area of the orthographic projection of the second active portion on the base substrate.

12. The display panel according to claim 11, wherein the pixel driving circuit further comprises a capacitor connected between the gate of the driving transistor and a power line, and the second conductive layer further comprises:
a third conductive portion configured to form an electrode of the capacitor, and the electrode being connected to the power line;
the second active portion comprises:
a fourth active sub-portion connected to the third active sub-portion, wherein an orthographic projection of the fourth active sub-portion on the base substrate extends along the first direction and at least partially overlaps with the orthographic projection of the first gate line on the base substrate;
a fifth active sub-portion connected to the fourth active sub-portion, wherein an orthographic projection of the fifth active sub-portion on the base substrate extends along a second direction and overlaps with the orthographic projection of the second gate line on the base substrate;
a sixth active sub-portion connected to the fifth active sub-portion, wherein an orthographic projection of the sixth active sub-portion on the base substrate at least partially overlaps with an orthographic projection of the third conductive portion on the base substrate.

13. The display panel according to claim 12, wherein a size of the orthographic projection of the fifth active sub-portion on the base substrate in the first) direction is smaller than a size of the orthographic projection of the sixth active sub-portion on the base substrate in the first direction.

14. The display panel according to claim 12, wherein an overlapping area of the orthographic projection of the fourth active sub-portion on the base substrate and the orthographic projection of the first gate line on the base substrate is S1;
an overlapping area of the orthographic projection of the fifth active sub-portion on the base substrate and the orthographic projection of the second gate line on the base substrate is S2;
wherein S1 is larger than S2.

15. The display panel according to claim 10, wherein,
the pixel driving circuit further comprises a capacitor connected between the gate of the driving transistor and a power line, and the second conductive layer further comprises:
a third conductive portion configured to form an electrode of the capacitor, and the electrode being connected to the power line;
the first connection portion comprises:
a fourth conductive portion connected to the third active sub-portion through a via hole, wherein an orthographic projection of the fourth conductive portion on the base substrate at least partially overlaps with the orthographic projection of the first gate line on the base substrate;
a fifth conductive portion connected to the fourth conductive portion, wherein an orthographic projection of the fifth conductive portion on the base substrate overlaps with the orthographic projection of the second gate line on the base substrate;
a sixth conductive portion connected to the fifth conductive portion, wherein an orthographic projection of the sixth conductive portion on the base substrate at least partially overlaps with the orthographic projection of the third conductive portion on the base substrate;
wherein a size of the orthographic projection of the fifth conductive portion on the base substrate in the first direction is smaller than a size of the orthographic projection of the sixth conductive portion on the base substrate in the first direction.

16. The display panel according to claim 9, wherein the display panel further comprises a fifth conductive layer located at a side of the fourth conductive layer away from the base substrate, and the fifth conductive layer comprises:
a power line, an orthographic projection of the power line on the base substrate extending along a second direction and covering the orthographic projection of the second active portion on the base substrate.

17. The display panel according to claim 16, wherein,
the power line comprises a sixth extension portion and a seventh extension portion, wherein a size of an orthographic projection of the sixth extension portion on the base substrate in the first direction is larger than a size of an orthographic projection of the seventh extension portion on the base substrate in the first direction;
the orthographic projection of the sixth extension portion on the base substrate covers the orthographic projection of the second active portion on the base substrate;
wherein the sixth extension portion is defined with a second opening, and an orthographic projection of the second opening on the base substrate at least partially overlaps with the projection of the second gate line on the base substrate.

18. The display panel according to claim 4, wherein the display panel further comprises:
an anode layer located at a side of the fifth conductive layer away from the base substrate, the anode layer comprises a plurality of anode portions, and orthographic projections of the anode portions on the base substrate cover the orthographic projection of the first active portion on the base substrate.

19. The display panel according to claim 4, wherein the display panel further comprises:
- a first active layer located between the base substrate and the first conductive layer, and a partial structure of the first active layer being configured to form channel regions of the driving transistor and the fourth transistor;
- a third conductive layer located between the second active layer and the fourth conductive layer and comprising a fourth gate line;
- wherein an orthographic projection of the fourth gate line on the base substrate extends along the first direction and at least partially overlaps with the orthographic projection of the second gate line on the base substrate, and a partial structure of the fourth gate line is configured to form a second gate of the second transistor.

20. A display device comprising a display panel, wherein the display panel comprises a pixel driving circuit, the pixel driving circuit comprises a driving transistor, a second transistor and a fourth transistor, the second transistor is provided with a first electrode connected to a gate of the driving transistor and a second electrode connected to a second electrode of the driving transistor, the fourth transistor is provided with a first electrode connected to a data line and a second electrode connected to a first electrode of the driving transistor, the driving transistor and the fourth transistor are P-type transistors, the second transistor is an N-type transistor, the display panel further comprises:
- a base substrate;
- a first conductive layer located at a side of the base substrate and comprising: a first gate line and a first conductive portion, an orthographic projection of the first gate line on the base substrate extending along a first direction, a partial structure of the first gate line being configured to form a gate of the fourth transistor, and the first conductive portion being configured to form the gate of the driving transistor;
- a second conductive layer located at the side of the base substrate and comprising a second gate line, an orthographic projection of the second gate line on the base substrate extending along the first direction, and a partial structure of the second gate line being configured to form a first gate of the second transistor, and the orthographic projection of the second gate line on the base substrate being located between an orthographic projection of the first conductive portion on the base substrate and the orthographic projection of the first gate line on the base substrate;
- a second conductive portion, an orthographic projection of the second conductive portion on the base substrate at least partially overlapping with the orthographic projection of the first gate line on the base substrate;
- a fourth conductive layer located at the side of the base substrate and comprising a first connection portion connected to the first conductive portion and the second conductive portion respectively through a via hole.

* * * * *